(12) United States Patent
Kirchner et al.

(10) Patent No.: US 7,795,882 B2
(45) Date of Patent: Sep. 14, 2010

(54) OPERATOR SENSING CIRCUIT FOR DISABLING MOTOR OF POWER EQUIPMENT

(75) Inventors: Markus Kirchner, Frickenhausen (DE); Markus Neidert, Dettingen/Teck (DE); Ralph Sauter, Frickenhausen (DE); Bernhard Mittmann, Neu-Ulm (DE)

(73) Assignee: Gustav Magenwirth GmbH & Co. KG, Bad Urach (DE)

( * ) Notice: Subject to any disclaimer, the term of this patent is extended or adjusted under 35 U.S.C. 154(b) by 0 days.

(21) Appl. No.: 11/504,886

(22) Filed: Aug. 15, 2006

(65) Prior Publication Data

US 2006/0273806 A1  Dec. 7, 2006

Related U.S. Application Data

(63) Continuation of application No. PCT/EP2005/001647, filed on Feb. 17, 2005, which is a continuation-in-part of application No. 10/779,829, filed on Feb. 17, 2004, now Pat. No. 7,034,552.

(51) Int. Cl.
*G01R 27/26* (2006.01)
(52) U.S. Cl. .................................. 324/686; 324/672
(58) Field of Classification Search ................. 324/658, 324/678, 686, 688, 76.66, 672; 200/600
See application file for complete search history.

(56) References Cited

U.S. PATENT DOCUMENTS

| | | | |
|---|---|---|---|
| 2,725,548 A | 11/1955 | Harris | |
| 3,703,217 A | 11/1972 | Kulick et al. | |
| 4,145,864 A | 3/1979 | Brewster, Jr. | |
| 4,493,180 A | 1/1985 | Wick | |
| 4,814,632 A * | 3/1989 | Glaeser et al. | 307/116 |
| 5,583,386 A | 12/1996 | Meixner et al. | |
| 5,796,183 A * | 8/1998 | Hourmand | 307/116 |
| 6,377,009 B1 * | 4/2002 | Philipp | 318/468 |
| 6,501,281 B1 * | 12/2002 | Rundo | 324/658 |
| 6,501,284 B1 * | 12/2002 | Gozzini | 324/681 |
| 6,590,171 B1 | 7/2003 | Wolf et al. | |

(Continued)

FOREIGN PATENT DOCUMENTS

DE  43 44 187  6/1995

(Continued)

OTHER PUBLICATIONS

QT110 (QUANTUM Qtouch Sensor IC Application Data Sheet) 1999-2004.*

*Primary Examiner*—Jeff Natalini
(74) *Attorney, Agent, or Firm*—Lipsitz & McAllister, LLC

(57) ABSTRACT

An electrical characteristic in an operator-sensing circuit having a microcontroller that commands a charge sensor to send a sensor charge signal to a capacitive sensing element. The charge sensor outputs a corresponding raw data signal to the microcontroller that in turn sends a signal that disables the motor of a unit power equipment upon the absence of an operator's hand on a hand-gripping surface of the equipment. Capacitive means for operating within a predetermined charge range that includes preselected values that designate hands-off and hands-on conditions on the hand-gripping surface. The capacitor charge range is effective to distinguish between the presence of an operator's hand and foreign material on the gripping surface for avoiding a false hands-on-signal.

34 Claims, 10 Drawing Sheets

U.S. PATENT DOCUMENTS

| | | | |
|---|---|---|---|
| 6,650,126 B1 * | 11/2003 | Indihar | 324/658 |
| 6,894,507 B2 | 5/2005 | Morimoto | |
| 7,034,552 B2 * | 4/2006 | Kirchner et al. | 324/686 |
| 7,154,393 B2 * | 12/2006 | Okushima et al. | 340/562 |
| 7,498,822 B2 * | 3/2009 | Lee | 324/662 |
| 2003/0202851 A1 | 10/2003 | Kovarik | |
| 2007/0034243 A1 * | 2/2007 | Miller | 135/67 |

FOREIGN PATENT DOCUMENTS

| | | |
|---|---|---|
| DE | 198 43 666 | 3/2000 |
| DE | 102 19 368 | 11/2003 |
| EP | 0 701 917 | 3/1996 |
| EP | 701917 A1 * | 3/1996 |
| EP | 1 250 493 | 10/2002 |

\* cited by examiner

OPERATOR SENSING CIRCUIT FOR DISABLING MOTOR OF POWER EQUIPMENT

This application is a continuation of PCT/EP2005/001647 filed on Feb. 17, 2005, which application is a continuation-in-part of U.S. patent application Ser. No. 10/779,829 filed on Feb. 17, 2004, now U.S. Pat. No. 7,034,552.

BACKGROUND OF THE INVENTION

1. Filed of the Invention

This invention relates generally to a capacitive, operator-sensing circuit for disabling full operation of a device in particular by disabling a component of said device such as for example the drive, in particular the motor of power equipment.

More particularly, the invention relates to a capacitive, operator-sensing circuit having a charge transfer sensor coupled to a capacitive sensing electrode affixed to a gripping surface that allows power equipment operation when manually grasped but disables full operation of said device upon sensing removal of an operator's hand from the gripping surface.

2. Description of the Prior Art

Manually-operated power lawn and garden maintenance equipment, construction equipment, and agricultural implements such as chainsaws, lawnmowers, snow-blowers, lawn edgers, garden tractors, cultivators, and the like are in widespread use. Such equipment includes dual hand-grips, a steering wheel, or a handle bar having a gripping surface that the operator grasps to operate and control it. Known mechanical and electrical dead-man switches sense the absence of the operator's hand on the gripping surface and send a signal to disconnect the motor of the power equipment. While such mechanical switches are known commercially, no electrical dead-man switch system is currently commercially viable.

U.S. Pat. No. 3,703,217 discloses an electrical system comprising a steering wheel including a capacitive sensing electrode that produces a first value of charge in the presence of the operator's hand, and a second value in its absence. A bridge circuit acts as a charge transfer processing sensor that provides an electrical charge to the sensing electrode and generates a first output signal when sensing the first value of electrode charge in the presence of the operator's hand a and a second output signal when sensing the second value of electrode charge. The respective first and second sensor output signals are electrically coupled to allow the motor of the vehicle to continue operating, or to shut the vehicle down when they differ.

U.S. Pat. No. 6,501,281 discloses a self-calibrating charge-transfer processing sensor that periodically sends an electrical charge to a capacitive sensing electrode that produces a first value of charge in the presence of the operator's hand, and a second value in its absence. The charge-transfer sensor then senses and processes the first and second electrode charge values to produce respective output signals to allow the vehicle motor to continue operating, or to shut the vehicle down by switching off the power unit on sensing a second value different from the first value.

Without a man touching the gripping surface ("hands-off" status) this type of system has an overall electrical capacitance. Upon touching the gripping surface ("hands-on" status), the system capacitance increases. Upon starting the power equipment engine, the known QT sensor calibrates itself and sets the measured capacity as a "hands-off" status at the sensing electrode affixed to the gripping surface. It is possible that starting the equipment motor requires a first person to start the motor while another holds the gripping surface. Then when the engine is started with the operator's hands actually on the gripping surface, the disclosed self-calibrating sensor defines that "hand-on" condition as a "hands-off" status. A physical change from a "hands-on" gripping surface status to a "hand-off" status reduces the overall capacitance of the system. So if the sensor calibrates itself with a faulty "hands-on" status as described, the "hands-off" status will not be detected until the next calibrating process that occurs after the next change of system capacitance. For the prior art sensor registers only one-way changes of capacitance in the disclosed system.

Described in terms of bit information values—digits, the charge transfer sensor periodically sends charge to the operator-sensing electrode and receives values from the electrode that the sensor internally processes. The sensor sets a standard "hands-off" first value number of digits each time the power equipment is started. Subsequently each time the sensor transfers an charge to the electrode, the sensor receives and internally processes a return value to produce a sensor-processed output signal that will stop the power equipment engine if the second digit value is different from the first digit value. The startup self-calibration of an internally processing sensor is faulty and leads to another problem.

Often water and dirt are found on the gripping surface and/or the operator may use gloves that increase the overall capacitance of the sensing circuit. Because the sensor is self-calibrating and self-processing, the presence of water and dirt or mud may change the first and second value of the return signal to the sensor so that the system does not distinguish between a "hands-on" and a "hands-off" condition. Therefore it may issue output signals to stop the motor while an operator's hand is still grasping the gripping surface.

Another problem discovered with the '281 patent sensing electrode is that the circuit may not consistently distinguish between a "hands-on" gripping surface status and the presence of the water, dirt, and/or muddy mixture. The problem is greater if the operator is wearing gloves.

OBJECT OF THE INVENTION

An object of the invention is to provide an operator-sensing circuit that has no false "hands-on" status digit sensing values.

SUMMARY OF THE INVENTION

The object is solved by an operator sensing circuit for a hand-grip of a device comprising:

at least one capacitive sensing element incorporated in said hand-grip, having a capacity which is increased in a hands-on state of an operator's hand on said hand-grip when compared with a hands-off state of said hand-grip, a charge sensor detecting at least a capacity of said sensing element and generating a capacity signal value representing said detected capacity, a controller connected to said charge sensor and receiving said capacity signal value, said controller comparing said capacity signal value with a pre-selected hands-on threshold value in order to distinguish between a proper hands-on state which is present if the capacity signal value is below said hands-on threshold or a non-proper hands-on state, which is present if the capacity signal value is above said hands-on threshold.

The concept of the present invention ensures the circuit's ability to distinguish between an operator's hand and foreign material on the gripping surface.

Preferably said controller when detecting the proper hands-on state enables full operation of said device.

Under full operation of said device is to be understood that all possible functions and options incorporated in said device are available in the course of operation.

Further it is provided in an embodiment that said controller when determining the presence of the non-proper hands-on state disables full operation of said device.

Under disabling of full operation of said device it is understood that the operation of said device is at least limited to certain specific operations of said device which can be allowed without any problems even though the operator's hand is not anymore on the hand-grip and therefore might touch the device in all possible available sections and areas.

In particular it is provided that said controller when determining the presence of the non-proper hands-on state reduces operation of said device to a safe operational state.

Under a safe operational state it is understood that all operations are excluded which could cause damage or injury to the operator.

One particular embodiment provides that said controller stops driving of a dangerous component of said device. For example such a dangerous component of said device can be the chain of a chainsaw or the knife of a lawnmower.

In particular one specific embodiment of the present invention provides that said controller interrupts a drive train for said dangerous component of said device.

Interruption of a drive train for said dangerous component of said device might be release of a clutch in the drive train for said dangerous component so that the dangerous component is not driven anymore.

Interruption of a drive train may also comprise stop of the motor of the drive train.

Another advantageous embodiment provides that in said controller a range of predefined operational values indicating proper operative conditions of said sensing element is stored and that said controller compares said capacity signal value with said range of predefined operational values in order to determine the presence of proper operative sensor conditions of said sensing element if said capacity signal value is within said range.

The advantage of this embodiment is to be seen in the fact that the capacity signal value is not only used to distinguished between a proper or a non-proper hands-on state. For example the capacity signal value could be far below the threshold if the sensor element is damaged and therefore, provides a capacity which is much higher than the capacity in a normal hands-on state.

In such a case the present embodiment enables to recognize damage of said sensing element or the electrical connection of said sensing element and to indicate this to the operator.

Such a range of predefined operational values is not necessary to be limited by the stored hands-on threshold value.

However, in order to make the inventive concept as simple as possible it is provided that said range of predefined operational values extends from a preselected stored uppermost limit value above said pre-selected stored hands-on threshold value to a pre-selected lowermost limit value.

In particular the uppermost limit value defined a boundary undue decrease of the capacity of the sensing element, which can be due to a broken cable. Advantageously the uppermost limit value is in the range of about 1.5 to about 2 times the hands-on threshold value. For example if the hands-on threshold value is 760 digits the uppermost limit value is 1350 digits.

In particular the lowermost value defines a boundary for an undue increase of capacity of the sensing element. Advantageously the lowermost limit value is in the range of about 0.2 to about 0.3 times the hands-on threshold value. For example if the hands-on threshold value is 760 digits the lowermost limit value is 180 digits.

One advantageous embodiment provides that said controller when determining the presence of proper operative sensor conditions enables full operation of said device.

Further it is provided that said controller when not determining the presence of proper operative sensor condition disables full operation of said device.

In particular safe operation can be provided if said controller when not determining proper operative sensor condition reduces operation of said device to a safe operational state.

In particular said safe operational state can be obtained by a stop of the driving of the dangerous component, in particular interruption of a drive train for said dangerous component.

A further improved embodiment of the present invention provides that said charge sensor detects a capacity of a capacitve reference simulator element and generates a reference signal value indicative of said capacity and wherein said controller receives said reference signal value and compares it with a preselected stored reference range in order to determine proper operative circuit conditions of said sensing circuit if said reference signal value is within said reference range.

The aforementioned inventive concept provides a continuous check on the overall capacity with a capacitive reference simulator electrode to monitor for defects in the system, and a fail-safe microcontroller.

A preferred version of this embodiment provides that said controller when determining the presence of proper operative circuit conditions enables full operation of said device.

Further it is of advantage if said controller when not determining the presence of proper operative circuit conditions disables full operation of said device.

In particular it is of advantage if said controller when not determining the presence of proper operative circuit conditions reduces operation of said device to a safe operational state.

Such a safe operational state can be obtained by stop of the drive of a dangerous component of said device or by interruption of a drive train for said dangerous component.

According to the aforementioned embodiments it is not specified how the capacities of said at least one sensing element and said reference simulator element are detected.

Preferably it is provided that said charge sensor sequentially detects said capacity of said at least one sensing element and said reference simulator element.

In addition, the operator sensing circuit as described above is not limited to one sensing element. It is easy to provide such an operator sensing circuit with a plurality of sensing elements.

In particular a first sensing element and a second sensing element are provided and said charge sensor then sequentially detects said capacity of said first sensing element and said second sensing element.

If said charge sensor shall sequentially detect various sensing elements including a reference simulator element it is of advantage if said charge sensor is sequentially connected to said at least one sensing element and said reference simulator element by a multiplexer.

Preferably such a multiplexer is controlled by said microcontroller.

In a further advantageous embodiment of said operator sensing circuit said capacitive sensing element comprises a first electrode arranged on an inner dielectric member, said inner dielectric member being disposed on a second electrode, and said first electrode being covered by an outer dielectric member.

Such a design is very simple and allows in a simple manner to provide a gripping surface on said outer dielectric member which when gripped by an operator's hand increases the capacity of said capacitive sensing element.

Said first electrode can be of any possible design.

However, it turned out to be of advantage if said first electrode has a tube like structural configuration.

Such a tube like structural configuration can have various dimensions.

It has been found to be of advantage if said tube like structural configuration extends between opposed edges in direction of its axis with an extension which is smaller then the extension of an operator's hand in this direction when gripping said hand-grip.

Such a design allows arrangement of said tube like structural configuration such that the first electrode is always covered by a reasonable extend by the operator's hand when gripping said hand-grip.

In principle it is possible to obtain said first electrode by a helical wound wire or a wire net.

However one advantageous embodiment comprises a conductive foil at a first electrode.

Such a conductive foil is easy to handle and easy to apply on the inner dielectric member.

Further such a tube has been shown to be less critical in its behavior with respect to dirt or water applied to the hand-grip.

In particular it has been shown to be of advantage if said conductive foil is essentially free of perforations, which means that the foil extends continuously from one of its edges to the other of the edges without any interuptions.

Preferably such conductive foil is formed to a tube.

One specific embodiment of the present invention provides that said conductive foil has the form of a strip with opposed lateral edges forming said opposed lateral edges of said first electrode when formed to said tube.

In a further advantageous embodiment it is provided that said second electrode is formed by a handle gripping portion of a handle or a handlebar of said device.

Preferably said handlebar is made out of a conductive material and therefore can be easily connected to ground of said operator sensing circuit.

One particular advantageous embodiment provides that said first and second electrodes together with said inner dielectric member therebetween establish a first capacity and said first electrode with said gripping surface and said outer dielectric member therebetween established a second capacity which in a hands-on state is in series with a third capacity formed by the human body and which together with said third capacity is arranged in parallel to said first capacity. Such a design has the advantage that it provides optimum sensitivity to a human hand gripping said hand-grip and the lowest possible sensitivity to dirt or water on said hand-grip.

Preferably said second capacity is greater than said first capacity so that an optimum change in capacity is achieved when changing from the hands-off state to the hands-on state.

In a further advantageous embodiment of the operator sensing circuit said sensor is provided with a receiving capacitor and said sensor in a charge detecting cycle performs a plurality of charge/discharge cycles within each of which the capacity in the element to be detected is charged and thereafter discharged into receiving capacitor until said receiving capacitor is charged to a pre-defined level.

Further the object outlined before is solved by a method for operating an operator sensing circuit for a hand-grip of a device comprising the following steps:

detecting a capacity of at least one capacitive sensing element incorporated in said hand-grip, generating a capacity signal value representing said detected capacity, comparing said capacity signal value with a hands-on threshold values in order to distinguish between a proper hands-on state which is present if the capacity signal value is below said hands-on threshold or a non-proper hands-on state, which is present if the capacity signal value is above said hands-on threshold.

Further advantageous embodiments are based on the same concepts as outlined above in connection with the various embodiments of the operator sensing device described before.

Another advantage of the invention is to provide an operator-sensing circuit having said built-in calibration to establish a safe-operating band of digit sensing values with a pre-selected maximum "hands-off" digit value and a lower "hands-on" digit value that are not adversely affected by foreign materials located on the gripping surface.

A further advantage of the invention is to provide an operator-sensing circuit having a sensor that does not internally process the electrode digit signals but simply counts the digit value to send a raw data output signal to a microcontroller, which processes and evaluates the signal to determine whether or not to disable the power equipment motor.

Still another advantage of the invention is to provide an operator-sensing circuit having a fail-safe microcontroller to ensure valid processing of the raw data output signal produced by the sensor.

A still further advantage of the invention is to provide an operator-sensing circuit having a system capacitive check using a simulated reference sensing electrode to confirm valid operational conditions and to detect system defects such as short circuits, breaks in transmitting wires, and malfunctioning electrical system units.

Another advantage of the invention is to provide an electrical dead-man switch circuit that includes a capacitive operator-sensing electrode comprising an elongated metal foil tube having a length that is shorter than the width of an operator's hand and having end surfaces each disposed in a respective plane that is perpendicular to the longitudinal axis of the tube at opposed ends of the foil tube.

The advantage of inventive concept is further based on the fact that a physical electrode in the form of a wire coil or metal net wrapped around the handle within the gripping surface provides longer lateral edges. Longer lateral edges of the wire in the coil or net increases the capacitance of the prior art system, and it has been unexpectedly discovered that the known physical electrode structure is more sensitive to the presence of water, dirt, and/or muddy mixture.

One embodiment of the invention refers to an electrical characteristic in an operator-sensing circuit having a charge-transfer sensor that sends a sensor charge signal to a capacitive sensing electrode and receives a charge signal from the electrode for disabling the motor of a unit of power equipment upon the absence of an operator's hand on a hand-gripping surface of the equipment. The electrical characteristic comprises capacitive means for setting a predetermined operating output capacitor discharge range includes preselected binary digit values that designate hands-off and hands-on conditions on the hand-gripping surface.

The capacitor charge range is effective to distinguish between the presence of an operator's hand and foreing material on the gripping surface for avoiding a false hands-on signal.

The capacitive means advantageously includes operator-hand sensing electrode means having an inner dielectric material layer contiguously disposed on a metal handle portion of the power equipment, a metal conductor material layer contiguously disposed on the dielectric material, and an outer dielectric hand-grip material having a hand-gripping surface. So when the operator's hand grasps the outer hand-grip material disposed around the metal conductor material layer the capacitance is increased and the sensing electrode means produces a smaller charge signal to indicate a hands-on condition on the hand-gripping surface.

For example the capacitor charge range includes a hands-off section in which foreign materials such as water, dirt, and mudd add capacitance to the hand-gripping surface that may produce a false hands-on condition, and a true hands-on section in which the operator's hand is grasping the hand-gripping surface and provides an accurate capacitor discharge digit value that allows the power equipment continued operation.

In a specific embodiment the metal conductor layer includes a metal foil wrapped around the inner dielectric material. The inner dielectric material layer has the structural configuration of a tube that extends along the length of the metal handle portion.

The metal foil has the structural configuration of a tube having a longitudinal axis and that extends along a delimited length of the inner dielectric material tube.

The metal foil tube has opposed end edges that are each disposed in respective planes that traverse the longitudinal axis of the metal foil tube, and the outer hand-grip materials has a length sufficient to overlap the opposed end edges of the metal foil tube.

The metal handle portion is composed of steel having a layer thickness of about 2 mm, or of aluminum tubing up to 4 mm in thickness, and an outer diameter of about 20 to 30 mm.

The inner dielectric material is plastic material about 2 mm to about 6 mm, preferably about 3 mm to about 5 mm, in thickness and selected from the group consisting of polypropylene and polyethylene.

The metal conductor material comprises copper and the foil layer has a thickness of about 0.10 mm to about 0.15 mm. The metal foil tube has a length of from about 50 mm to about 60 mm, the opposed end edges are disposed about 30 mm from the ends of the hand-grip material, and the opposed respective transverse planes are perpendicular to the longitudinal axis of the foil tube.

Another feature of the invention is directed to a combination of multiplexing means and microcontroller means in an operator-sensing circuit having a charge-transfer sensor that sends a sensor charge signal to a capacitive sensing electrode and in response receives a charge signal from the electrode for disabling the motor of a unit of power equipment upon the absence of an operator's hand on a hand-gripping surface of the equipment the combination comprises capacitive means including operator-hand sensing electrode means and reference simulator electrode means for receiving the sensor charge signal from the multiplexing means.

The simulator electrode means is effective to send a reference charge signal having a designated standard digit value for determining a defect in the operator-sensing system.

The microcontroller means is electrically coupled to the multiplexing means that includes a series of switches for issuing electrode switching signals to alternately turn the series of switches on and off to sequentially send the sensor charge signal to each sensing electrode means and reference simulator electrode means, and in response to sequentially receive from each sensing and reference electrode means respective electrode charge signals. The microcontroller means is electrically coupled for issuing command signals to the charge-transfer sensor to send the charge signal to the multiplexing means for distribution to the sensing and reference electrode means. The charge-transfer sensor is effective to send a raw data output discharge signal corresponding to each respective electrode charge signal to the microcontroller means for processing. And the microcontroller means is effective to disable the engine upon determining that the reference discharge signal does not conform the designated standard digit value, and upon alternatively determining that the electrode sensing discharge signal indicates the absence of the operator's hand from the hand-gripping surface.

Another feature of the inventive circuit comprises capacitive means and the microcontroller means is programmable for setting a predetermined operating charge range including preselected values that designate hands-off and hands-on conditions on the hand-gripping surface.

The charge range is effective to distinguish between the presence of an operator's hand and foreign material on the gripping surface for avoiding a false hand-on signal.

In a specific embodiment, a preselected binary digit value of about 700 digits designates a hands-on condition for the sensing electrode means affixed to a hand-gripping surface, and a preselected binary digit value of about 900 digits designates a hands-off condition for the sensing electrode means affixed to a hand-gripping surface.

The charge value of said reference simulator electrode means is about 400 digits. The charge range includes a hands-off section in which foreign materials add capacitance to the hand-gripping surface that might produce a false hand-on condition, and a true hands-on section in which the operator's hand is grasping the hand-gripping surface to provide an accurate charge value that allows the power equipment continued operation. The capacitor value range of the true hands-on section is about 350 to about 750 digits, and the capacitor discharge digit value range of the false hands-on section is about 750 to about 900 digits.

A further inventive feature of the microcontroller means comprises a first microprocessor means electrically coupled to the charge-transfer sensor and second microprocessor means electrically coupled to the first microprocessor means. The first microprocessor means is electrically coupled to the multiplexing means for sequentially turning sensing element and reference simulator element switches on and off to send said charge signals through to the respective sensing and reference elements. The first microprocessor means is effective for commanding the sensor to send charge signals to the multiplexing switches to be sent through to the sensing and reference element that in response provide capacitive charge signals to the sensor means which produces respective raw data output signals corresponding to the capacitive discharge signals received.

The second microprocessor means is effective to watch for proper operation of the first microprocessor means by periodically control checking on the first microprocessor means The first and second microprocessor means are electrically coupled to respective relay switches that are, in turn, electrically coupled to the ignition system of the motor.

Each of the first and second microprocessor means independently produces an output microprocessor signal to its respective relay switch that is effective to shut the ignition down when said microprocessor output signals to their respective relay switches are not the same.

A further feature of the invention is a method of sensing the presence of an operator's hand on a gripping surface of a power equipment unit and causing cessation of operation of a component system of the equipment if the operator's hand is removed from the gripping surface.

The method comprises providing a sensing electrode affixed to said gripping surface that includes a capacitive means for operating within a predetermined capacitor charge range including preselected binary digit values that designate hands-off and hands-on conditions on the hand-gripping surface.

The capacitor charge range is effective to distinguish between the presence of an operator's hand and foreign material on the gripping surface for avoiding a false hands-on signal.

The capacitor charge range includes a hands-off section in which foreign materials add capacitance to the hand-gripping surface that may produce a false hands-on condition, and a true hands-on section in which the operator's hand is grasping the hand-gripping surface and provides an accurate capacitor charge value that allows the power equipment continued operation.

Providing a charge-transfer sensor electrically coupled to the sensing electrode, and providing microcontroller means electrically coupled to the charge-transfer sensor for periodically commanding the sensor to transfer charge to the sensing electrode that senses the quantity of charge on the sensing electrode and generates a raw data output signal to the microcontroller means when the quantity of charge on the sensing electrode is sensed.

Processing the raw data output signal in the microcontroller means to determine if the quantity of charge on the sensing electrode is in true hands-on section of the capacitor range. The microcontroller means is electrically coupled to the component system of the equipment and causes cessation of operation of the component system when the raw data output signal of the charge-transfer sensor indicates that the quantity of charge is not whithin the true hands-on section of said capacitor discharge range.

In one specific embodiment, the component system is an internal combustion engine of the equipment and electrically couples the ignition system of the engine to ground to shut off the engine when the raw data output signal indicates that the quantity of charge is not within the true hands-on section of said capacitor charge range. In another embodiment, the component system is an electric motor of the equipment and electrically interrupts a supply of power to the electric motor to shut off the electric motor when the raw data output signal indicates that the quantity of charge is not within the true hands-on section of said capacitor charge range.

An inventive specific embodiment of a combination of a capacitive operator-sensing circuit with a mobile power equipment unit comprises an internal combustion engine, a magneto of the engine's ignition system, and a hand-gripping surface for an operator to grip and control movement of the mobile power equipment unit.

The capacitive operator-sensing circuit is adapted to sense the presence of an operator's hand on the gripping surface to shut off the engine if the operator's hand is absent from both gripping surfaces in case of a not highly dangerous mobile power equipment unit such as for example a lawnmower, which can be operated with only one hand gripping one gripping surface and the other hand being in a hands-off state, whereas in case of dangerous mobile power equipment, such as for example a chainsaw, the engine will be shut-off if only one gripping surface is in the hands-off state.

The capacitive operator-sensing circuit includes sensing electrode means affixed to the gripping surface that includes capacitive means for operating within a predetermined charge range that includes preselected standard values that designate hands-off and hands-on conditions on the hand-gripping surface.

The charge range includes a hands-off section in which foreign materials add capacitance to the hand-gripping surface that may produce a false hands-on condition, and a true hands-on section which indicates that the operator's hand is grasping the hand-gripping surface.

The sensing electrode means is electrically coupled to charge-transfer sensor means for sensing any quantity of charge on the electrode means, and the charge-transfer sensor means is electrically coupled to the microcontroller means for periodically commanding the sensor means to transfer charge to the sensing electrode means, and to sense the quantity of charge on the sensing electrode means.

The sensor means is effective to generate raw data output signals for the microcontroller means to process when the quantity of charge on the sensing electrode is sensed.

The microcontroller means is effective to process a raw data output signal for determining if a corresponding quantity of charge on the sensing electrode is in the true hands-on section of the charge range.

The microcontroller means is electrically coupled to the magneto of the ignition system for causing cessation of the engine when the raw data output signal of the charge-transfer sensor means indicates that the sensed quantity of charge is not within the true hands-on section of said charge range.

One embodiment of an operator-sensing circuit has a charge-transfer sensor that sends a sensor charge signal to a capacitive sensing electrode and receives a discharge signal from the electrode for disabling the motor of a unit of power equipment upon the absence of an operator's hand on a hand-gripping surface of the equipment, the electrical characteristic comprising:

a) capacitive means for operating within a predetermined output capacitor discharge range that includes preselected binary digit values that designate hands-off and hands-on conditions on the hand-gripping surface;

b) said capacitor discharge range is effective to distinguish between the presence of an operator's hand and foreign material on the gripping surface for avoiding a false hands-on signal.

In said embodiment said capacitive means includes operator-hand sensing electrode means having an inner dielectric material layer contiguously disposed on a metal handle portion of the power equipment, a metal conductor material layer contiguously disposed on the dielectric material, and an outer dielectric hand-grip material including said hand-gripping surface thereby producing a capacitance in a grasping operator's hand, outer had-grip material, and the metal conductor material layer;

said conductor layer includes metal foil wrapper around said inner dielectric material.

In an improved version of said embodiment said metal conductor material comprises copper and the foil layer has a thickness of about 0.10 mm to about 0.15 mm.

In a further improved version said inner dielectric material layer has the structural configuration of a tube that extends along the length of the metal handle portion;

said metal foil has the structural configuration of a tube having a longitudinal axis and that extends along a delimited length of the inner dielectric material tube, and has opposed end edges that are each disposed in respective planes that traverse the longitudinal axis of the metal foil tube; and said outer hand-grip material has a length sufficient to overlap the opposed end edges of the metal foil tube.

In a further improvement of said embodiment said metal foil tube has a length of from about 50 mm to about 60 mm, the opposed end edges are disposed about 30 mm from the ends of the hand-grip material, and the opposed respective transverse planes are perpendicular to the longitudinal axis of the foil tube.

In particular said capacitor discharge range includes a hands-off section in which foreign materials add capacitance to the hand-gripping surface that may produce a false hands-on condition, and a true hands-on section in which the operator's hand is grasping the hand-gripping surface provides an accurate capacitor discharge digit value that allows the power equipment continued operation.

In another embodiment an operator-sensing circuit has a charge-transfer sensor that sends a sensor charge signal to a capacitive sensing electrode and in response receives a discharge signal from the electrode for disabling the motor of a unit of power equipment upon the absence of an operator's hand on a hand-gripping surface of the equipment, the combination comprising:

a) multiplexing means and capacitive means including operator-hand sensing electrode means and reference simulator electrode means for receiving said sensor charge signal from the multiplexing means;

b) said simulator electrode means being effective to send a reference discharge signal having a designated standard digit value for determining a defect in the operator-sensing system;

c) microcontroller means electrically coupled to said multiplexing means including a series of switches for issuing electrode switching signals to alternately turn said series of switches on and off to sequentially send said sensor charge signal to each sensing electrode means and reference simulator electrode means, and in response to sequentially receive from each sensing and reference electrode means respective electrode discharge digit signals;

d) said microcontroller means electrically coupled for issuing command signals to said charge-transfer sensor to send said charge signal to the multiplexing means for distribution to said sensing and reference electrode means;

e) said charge-transfer sensor being effective to send a raw data output discharge signal corresponding to each said respective electrode discharge digit signal to said microcontroller means for processing; and f) said microcontroller means being effective to disable said engine upon determining that the reference discharge signals does not conform to said designated standard digit value, and upon alternatively determining that the electrode sensing discharge signal indicates the absence of the operator's hand from the hand-gripping surface.

An improved version of said embodiment provides that said circuit includes capacitive means and said microcontroller means is programmable for setting a predetermined operating output capacitor discharge range including preselected binary digit values that designate hands-off and hands-on conditions on the hand-gripping surface;

said capacitor discharge range is effective to distinguish between the presence of an operator's hand and foreign material on the gripping surface for avoiding a false hands-on signal.

In particular a preselected binary digit value of about 700 digits designates a hands-on condition for the sensing electrode means affixed to a hand-gripping surface, and a preselected binary digit value of about 900 digits designates a hands-off condition for the sensing electrode means affixed to a hand-gripping surface.

Further the embodiment provides that said capacitor discharge digit value of said reference simulator electrode means is about 400 digits.

In particular in one embodiment said capacitor discharge range includes a hands-off section in which foreign materials add capacitance to the hand-gripping surface that might produce a false hands-on condition, and a true hand-on section in which the operator's hand is grasping the hand-gripping surface to provide an accurate capacitor discharge digit value that allows the power equipment continued operation.

In an embodiment said capacitor discharge digit value range of said true hands-on section is about 700 to about 750 digits, and said capacitor discharge digit value range of said false hands-on section is about 750 to about 900 digits.

Further is an embodiment the microcontroller means includes a first microprocessor means electrically coupled to the charge-transfer sensor and second microprocessor means electrically coupled to the first microprocessor means;

said first microprocessor means electrically coupled to the multiplexing means for sequentially turning sensing electrode and reference simulator electrode switches on and off to send said charge signals through to the respective sensing and reference electrode means;

said first microprocessor means being effective for commanding the sensor to send charge signals to the multiplexing switches to be sent through to the sensing and reference electrode means that in response send capacitive discharge signals to the sensor means which produces respective raw data output signals corresponding to the capacitive discharge signals received;

said second microprocessor means being effective to receive the raw data output signals to conduct a control check on the first microprocessor means and to double check the raw data output signals;

said first and second microprocessor means being electrically coupled to respective relay switches that are, in turn, electrically coupled to the ignition system of the motor;

each said first and second microprocessor means independently processes said raw data output signals to produce an output microprocessor signal to its respective relay switch that is effective to shut the ignition down when said microprocessor output signals to their respective relay switches are not the same.

Another advantageous embodiment provides a method of sensing the presence of an operator's hand on a gripping surface of a power equipment unit and causing cessation of operation of a component system of the equipment if the operator's hand is removed from the gripping surface, the steps of the method comprising:

a) providing a sensing electrode affixed to said gripping surface that includes a capacitive means for operating within a predetermined output capacitor discharge range including preselected binary digit values that designate hands-off and hands-on conditions on the hand-gripping surface;

b) said capacitor discharge range is effective to distinguish between the presence of an operator's hand and foreign material on said gripping surface for avoiding a false hands-on signal;
c) said capacitor discharge range includes a hands-off section in which foreign materials add capacitance to the hand-gripping surface that may produce a false hands-on condition, and a true hands-on section in which the operator's hand is grasping the hand-gripping surface and provides an accurate capacitor discharge digit value that allows the power equipment continued operation;
d) providing a charge-transfer sensor electrically coupled to the sensing electrode;
e) providing microcontroller means electrically coupled to the charge-transfer sensor for periodically commanding the sensor to transfer charge to the sensing electrode that senses the quantity of charge on the sensing electrode and generates a raw data output signal to the microcontroller means when the quantity of charge on the sensing electrode is sensed;
f) processing the raw data output signal in said microcontroller means to determine if the quantity of charge on the sensing electrode is in said true hands-on section of the capacitor range;
g) said microcontroller means is electrically coupled to said component system of the equipment and causes cessation of operation of the component system when the raw data output signal of the charge-transfer sensor indicates that the quantity of charge is not within the true hands-on section of said capacitor discharge range.

In particular the component system is an internal combustion engine of the equipment and electrically couples the ignition system of the engine to ground to ground to shut off the engine when the raw data output signal indicates that the quantity of charge is not within the true hands-on section of said capacitor discharge range.

Advantageously the component system is an electric motor of the equipment and electrically interrupts a supply of power to the electric motor to shut off the electric motor when the raw data output signal indicates that the quantity of charge is not within the true hands-on section of said capacitor discharge range.

Another embodiment provides a capacitive operator-sensing circuit in combination with a mobile power equipment unit, the combination comprising:
a) the mobile power equipment including an internal combustion engine, a magneto of the engine's ignition system, and a hand-gripping surface for an operator to grip and control movement of the mobile power equipment unit;
b) the capacitive operator-sensing circuit being adapted to sense the presence of an operator's hand on the gripping surface to shut off the engine if the operator's hand is absent from the gripping surface;
c) the capacitive operator-sensing circuit including sensing electrode means affixed to said gripping surface that includes capacitive means for operating within a predetermined output capacitor discharge range that includes preselected binary standard digit values that designate hands-off and hands-on conditions on the hand-gripping surface;
d) said capacitor discharge range including a hands-off section in which foreign materials add capacitance of the hand-gripping surface that may produce a false hands-on condition, and a true hands-on section which indicates that the operator's hand is grasping the hand-gripping surface;
e) said sensing electrode means is electrically coupled to charge-transfer sensor means for sensing any quantity of charge on the electrode means;
f) said charge-transfer sensor means is electrically coupled to the microcontroller means for periodically commanding the sensor means to transfer charge to the sensing electrode means, and to sense the quantity of charge on the sensing electrode means;
g) said sensor means being effective to generate raw data output signals for the microcontroller means to process when the quantity of charge on the sensing electrode is sensed;
h) said microcontroller means being effective to process a raw data output signal for determining if a corresponding quantity of charge on the sensing electrode is in said true hands-on section of the capacitor range,
i) said microcontroller means being electrically coupled to said magneto of the ignition system for causing cessation of the engine when the raw data output signal of the charge-transfer sensor means indicates that the sensed quantity of charge is not within the true hands-on section of said capacitor discharge range.

BRIEF DESCRIPTION OF DRAWINGS

Other objects of this invention will appear in the following description and appended claims, reference being made to the accompanying drawings forming a part of the specification wherein like reference characters designate corresponding parts to the several views.

DETAILED DESCRIPTION OF SPECIFIC EMBODIMENTS

Figure 1:
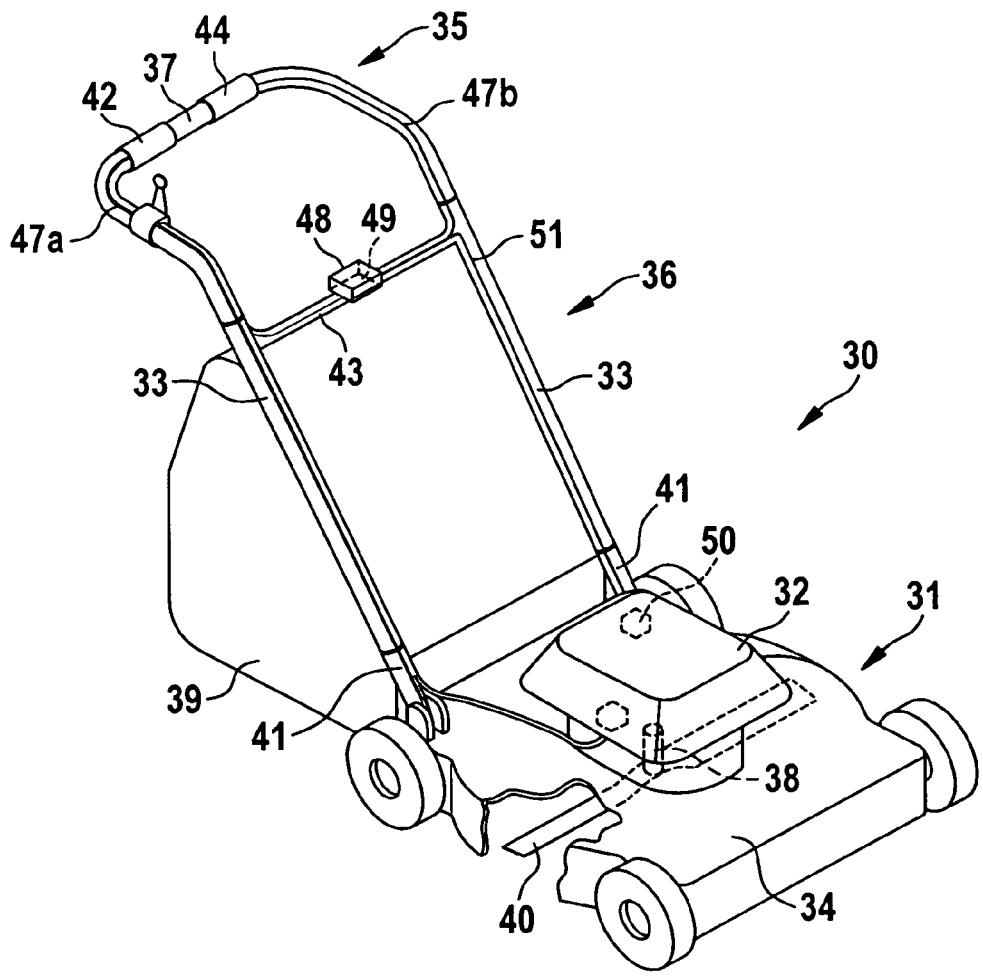
FIG. 1 is a perspective view of a lawnmower having an operating-sensing circuit of the invention.

A lawnmower, generally designated 30, includes a steel or aluminum housing 31 having a flat upper deck 34 that supports an internal combustion engine 32. In operation, engine 32 rotatably drives a vertical drive shaft 38 and a grass cutting blade 40 that is positioned below deck 34 and enclosed by housing 31. Handle 36 has an upper portion, generally designated 35, and two parallel angled portions 33 including respective end portions 41. The operator's hands are typically spaced apart at gripping surfaces 42a and 44a along handle-gripping portion 37. Handle 36 is comprised of steel aluminum with hand-grips 42 and 44 typically composed of soft plastic, rubber, or neoprene. The surface of hand-grips 42 and 44 define gripping surfaces 42a and 44a that the operator grasps at least one of said surfaces 42a, 44a when operating lawnmower 30.

Figure 2:
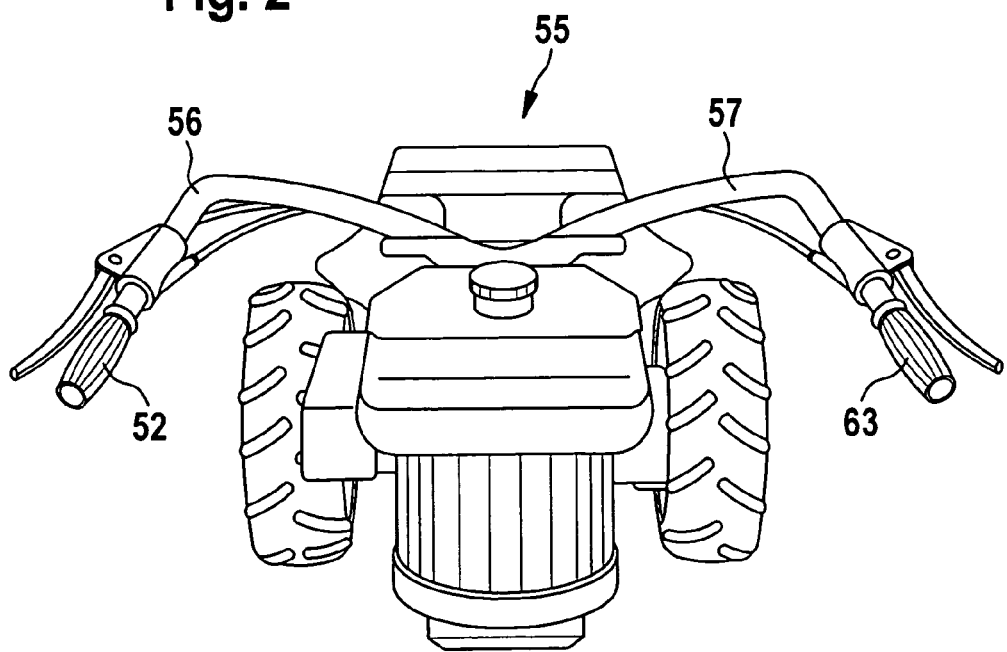
FIG. 2 is a perspective view of a motor vehicle having an operator-sensing circuit of the invention with dual hand-grip electrodes.

Hand guided motor driven tractor 55 is shown in FIG. 2.

Tractor 55 comprises two handle portions 56 and 57 with hand-grips 52 and 53 which are to be gripped by a person operating the motor driven tractor.

In particular for safety reasons it is necessary to insure that the person operating the tractor 55 guides tractor 55 by having both hands on both hand-grips 52 and 53.

Figure 3:
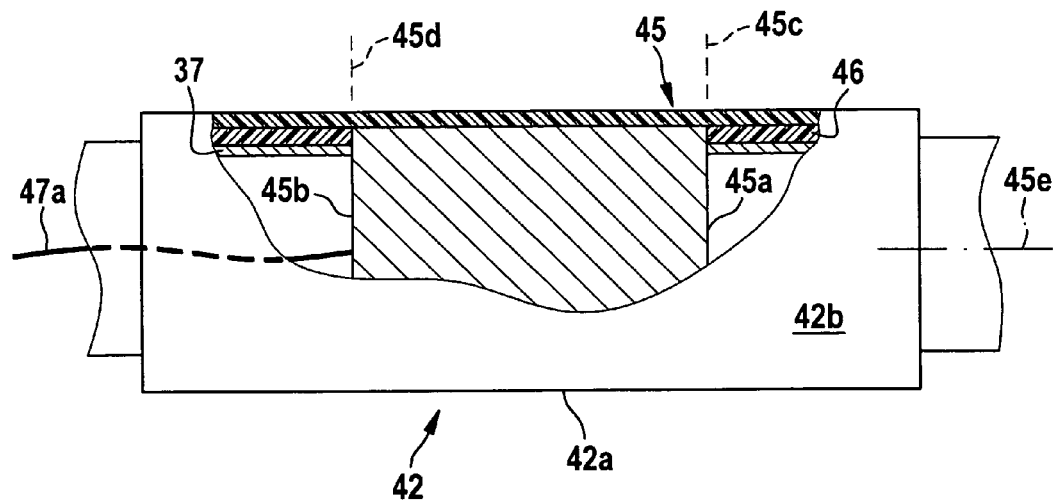
FIG. 3 is a fragmentary, elevational view, partially in section, of a hand-grip as shown on the lawnmower of FIG. 1.

Referring to FIG. 3, hand-grip 42 comprises an outer gripping layer disposed over metal foil tube 45 having opposed end surface edges 45a and 45b located in respective planes 45c and 45d that are perpendicular to the longitudinal axis 45e of metal fail tube 45. Metal foil tube 45 is disposed on a plastic tube 46 that is mounted to metal handle portion 37.

Outer cover 42b overlaps end edge surfaces 45a and 45b by about 30 millimeters with the length of metal coil tube 45 being about 50 millimeters. Shielded wires 47a and 47b direct signals to and from hand-grips 42 and 44 and to operator sensing circuit 100 comprising circuit board 49 bearing the system circuitry located in housing 48 mounted on cross-member 43. Shielded wire 51 directs signals from sensing circuit 100 to the ignition magneto 50 of motor 32.

Figure 4:
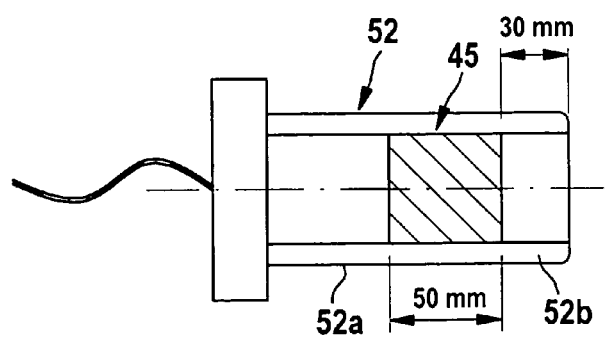
FIG. 4 is a diagrammatic elevational view of an operator-sensing electrode affixed to a gripping surface (not shown) of a hand-grip of the vehicle of FIG. 2.

Hand-grips 42, 44 on handle portion 37, and hand-grips 52, 53 on handle portions 56, 57 are associated with the metal foil tube 45 having edge surfaces 45a and 45b in a plane that is perpendicular to the longitudinal axis 45e of the hand grip 42 as shown in FIGS. 3 and 4. It has been unexpectedly found that the foil tube 45 (about 50 millimeters) of the invention must be shorter than the width of an operator's hand, and that the outer cover 42b should overlap the end edges by about 30 millimeters as in FIGS. 3 and 4.

Figure 5:
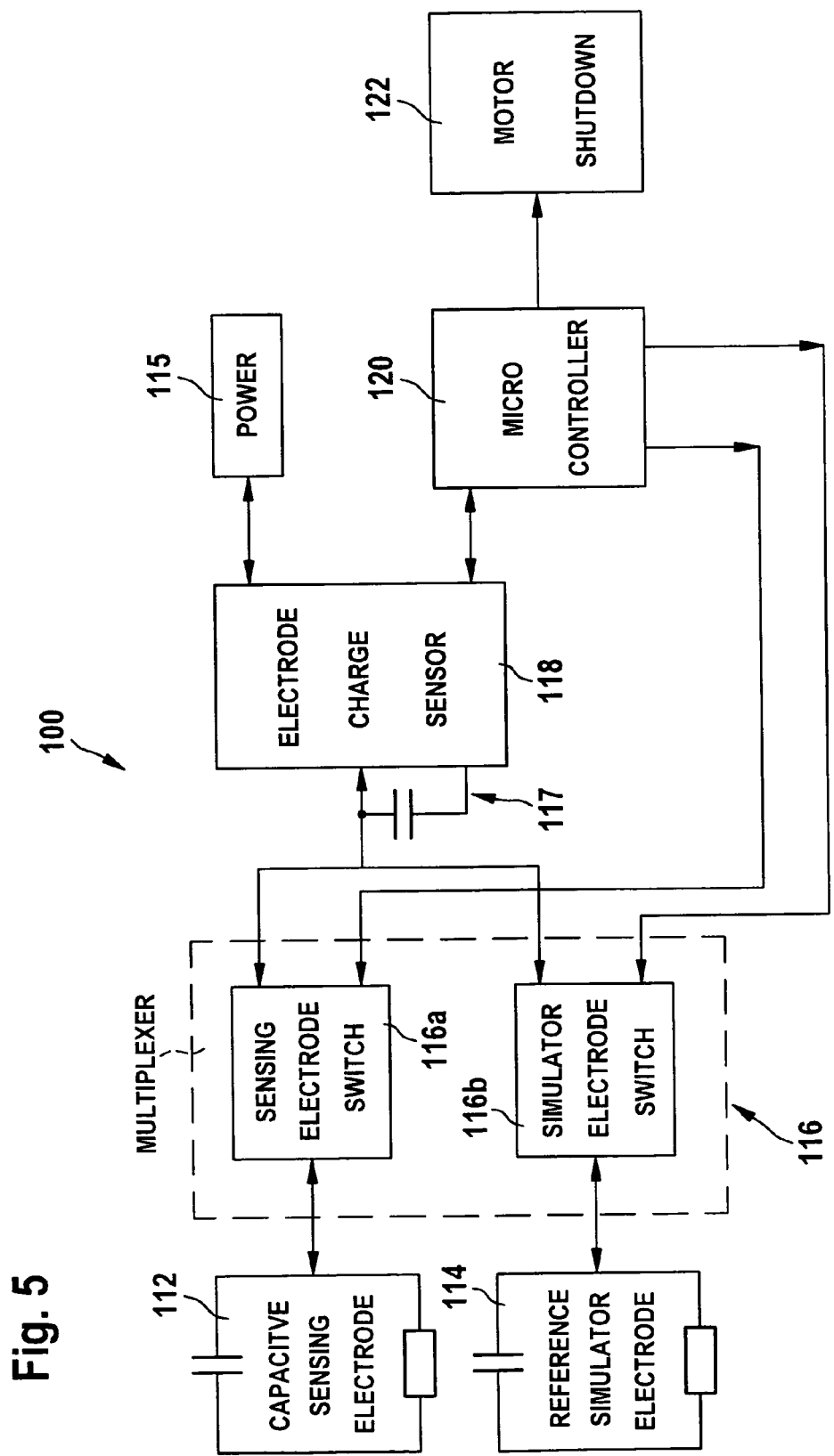
FIG. 5 is a schematic diagram of the operator-sensing circuit of the invention.

Referring to FIG. 5, a first embodiment of an operator-sensing circuit, generally designated 100, includes a capacitive sensing electrode or sensing element 112 affixed to the gripping surface of the power equipment and reference simulator electrode or reference simulator element 114 respectively connected electrically to sensing electrode or sensing element switch 116a and simulator electrode switch 116b of multiplexer 116.

Charge sensor 118 may be any programmable charge-transfer sensor that does not process the capacitance electrode discharge signals and is not self-calibrating.

In a specific embodiment charge, sensor 118 is a charge transfer sensor having commercial designation of QT 300 and receives electrical power from a 3-5 volt battery 115.

Sensor 118 sends information signals to multiplexer 116 upon command from microcontroller 120 which also sends a series of commands to multiplexer 116 to turn element switches 116a and 116b on and off to send the information signals to elements 112 and e.g. charges the capacitors of sensing elements 112 and 114 and in response receives an electrode charge signal through the closed (on) switch in multiplexer 116, e.g. determines the number of charge/discharge cycles necessary for charging capacitor 117 to a certain level by discharging the capacitors of sensing elements 112 or 114. Sensor 118 performs a measuring function in comparing the number of digits received from elements 112 and 114 with respect to capacitor 117, e.g. determining the number of charge/discharge cycles necessary for charging receiving capacitor 117 by charging the capacitors of elements 112 or 114 and discharging them to charge receiving capacitor 117 where the number of charge/discharge cycles is represented by a number of digits generated by charge sensor 118. Charge sensor 118 then provides a raw data output signal, e.g. the number of digits, to microcontroller 120 that knows to which elements 112 or 114 the charge signal value relates based on which switch microcontroller 120 has closed. Microcontroller 120 sends a cycle of sequential switching signals to multiplexer 116 to sequentially turn sensing element switch 116a and reference simulator element switch 116b on and off and to allow the information signals to flow to and from elements 112 and 114.

The information flow indicates a hands-on or hands-off status with respect to each operator hand-sensing and reference electrode in accord with the graphic diagram of FIG. 7 discussed below. While FIG. 5 shows only one sensing element 112, the process and circuit for performing the operator-sensing method of the invention may include two hand-grips as shown and used in the power equipment 30 and 55 of FIGS. 1 and 2.

On receiving the information charge of sensor 118, e.g. when being charged by sensor 118, elements 112 and 114 sequentially return charge to capacitor 117, the number of such charge discharge cycles being represented by binary information measured in digits and generated by charge sensor 118.

Operator-sensing circuit 100 is calibrated so that reference simulator element 114 always provides generation of for example a preselected standard of 1300 digits by charge sensor 118 so long as simulator element 114 sense no defect in multiplexer 116 or short circuit in the system.

If sensor 118 does not receive 1300 digits from reference element 114, micorcontroller 120 receives an output signal of raw data from sensor 118 to evaluate and process the reference return signal. Then sends a shut-down signal to motor shut-down circuit 122.

In one embodiment, the capacitance of reference element 114 is 33 pF ($33 \times 10^{-12}$ farads) and the capacitance of receiving capacitor 117 is 150 nF ($150 \times 10^{-9}$ farads).

As noted, operator-sensing unit circuit 100 of FIG. 5 can be used with only one hand-gripping surface as found on a chainsaw, for example. In power equipment having two hand-grips as shown in FIGS. 1 and 2, a capacitive sensing element 112 is affixed to the gripping surface of each hand-grip.

Charge sensor 118 provides one signal to multiplexer 116 so that when micorcontroller 120 commands charge sensor 118 and multiplexer 116 with switches 116a and 116b to turn on and off in sequence, that same impulse burst from charge sensor 118 will be sent to the respective sensing and simulator elements 112 and 114. Charge sensor 118 does not differentiate the location of the digit signal coming from the sensing element 112 and the reference simulator element 114. Charge sensor 118 simply generates the number of digits that are indicative of the capacity sensed via multiplexer 116 and microcontroller 120 compares it to the capacity value of capacitor 117 when charge sensor 118 sends an impulse burst signal of charge to the sensing elements 112 and reference simulator element 114.

When an operator's hand is on the gripping surface, the capacitance becomes larger and the number of digits sent from sensing element 112 to charge sensor 118, e.g. the number of charge and discharge cycles executes by sensor 118 in order to charge receiving capacitor 117 to a certain level, is accordingly smaller.

Figure 7:
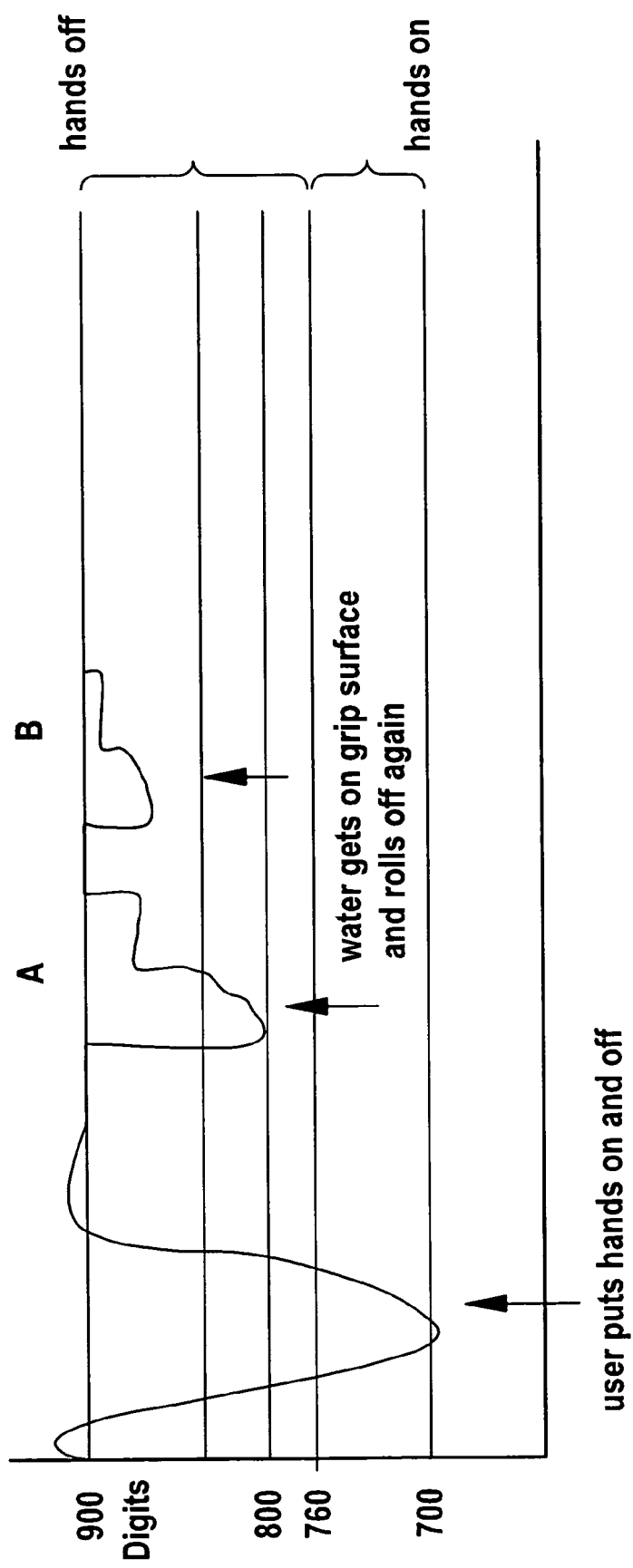
FIG. 7 is a graphic diagram showing a hands-on/hands-off calibrated detection zone of an operator-sensing circuit of the invention.

As shown in FIG. 7, the calibrated operator sensing circuit 100 shows capacitive means for operating within a predetermined capacitor charge range that includes preselected binary digit values that designate hands-off and hands-on conditions on the hand-gripping surface 42a, 44a. The capacitor charge range is effective to distinguish between the presence of an operator's hand and foreign material on the gripping surface 42a, 44a for avoiding a false hands-on signal, and shows that the capacitance of the system reads in two different directions.

The gripping surface capacitance of operating curve A shows that the longer the edge length of the metal electrode coil as found in U.S. Pat. No. 6,501,281, the more the capacitance of the electrode changes with the presence of water on the gripping surface. Curve B shows the capacitance curve with a metal foil with end edges having a length less than the wire coil as shown in curve A.

As shown, with a hands-on condition sensing element 112 will discharge about 700 to about 760 digits to sensor 118. With an hands-off condition on the gripping surface, about 760 to about 900 digits are sent to sensor 18. The band of a safe hands-off detection zone is in the range between 900 and 760 digits to a microcontroller 20 and microcontroller 20 when receiving such an amount of digits will decide to disable the component system of the power equipment 30 and 55.

Further microcontroller 120 will also decide to disable the component system of power equipment 30 if the number of digits received is above 1350 digits, because this indicates a short circuit or other damage to the sensing element.

Thus system 100 eliminates the possibility that a false hands-on condition will be reported to microcontroller 120 because water and dirt produces a capacitance discharge signal that is always in the hands-off section of the output discharge range as shown in FIG. 7.

If for example, the diameter of the hand-grip is about 20 to about 30 millimeters, the circumference at one end edge is about 60 to 90 millimeters so with two edges at opposed ends of the tube the approximate edge length is about 120 to 180 millimeters. Thus the metal foil tube 45 is less likely to be affected by water and dirt on the gripping surface. On the other hand, with about 2,000 millimeters length of edge such as may be available in a wire coil or net-shaped metal coil used on the electrode, the electrode capacitance is more likely to be more greatly increased to approach a false hands-on signal when water and dirt or a mixture thereof is on the hand-gripping surface 42a, 44a.

A glove on the hand would not produce as much capacitance as the bare hand, but would still fall within the hands-on segment below the gray band.

If charge sensor 118 outputs less than 760 digits then microcontroller 120 knows that a hands-on condition exists on the gripping surface.

The most difficult condition on the gripping surface 42, 42b is when the operator is wearing thick gloves and water and mud are present. The dark band is a safe band where neither constitutes a safe range of capacitance. So any digits above the lower limit of for example 760 digits of the gray band would stop the power equipment motor.

Figure 6:
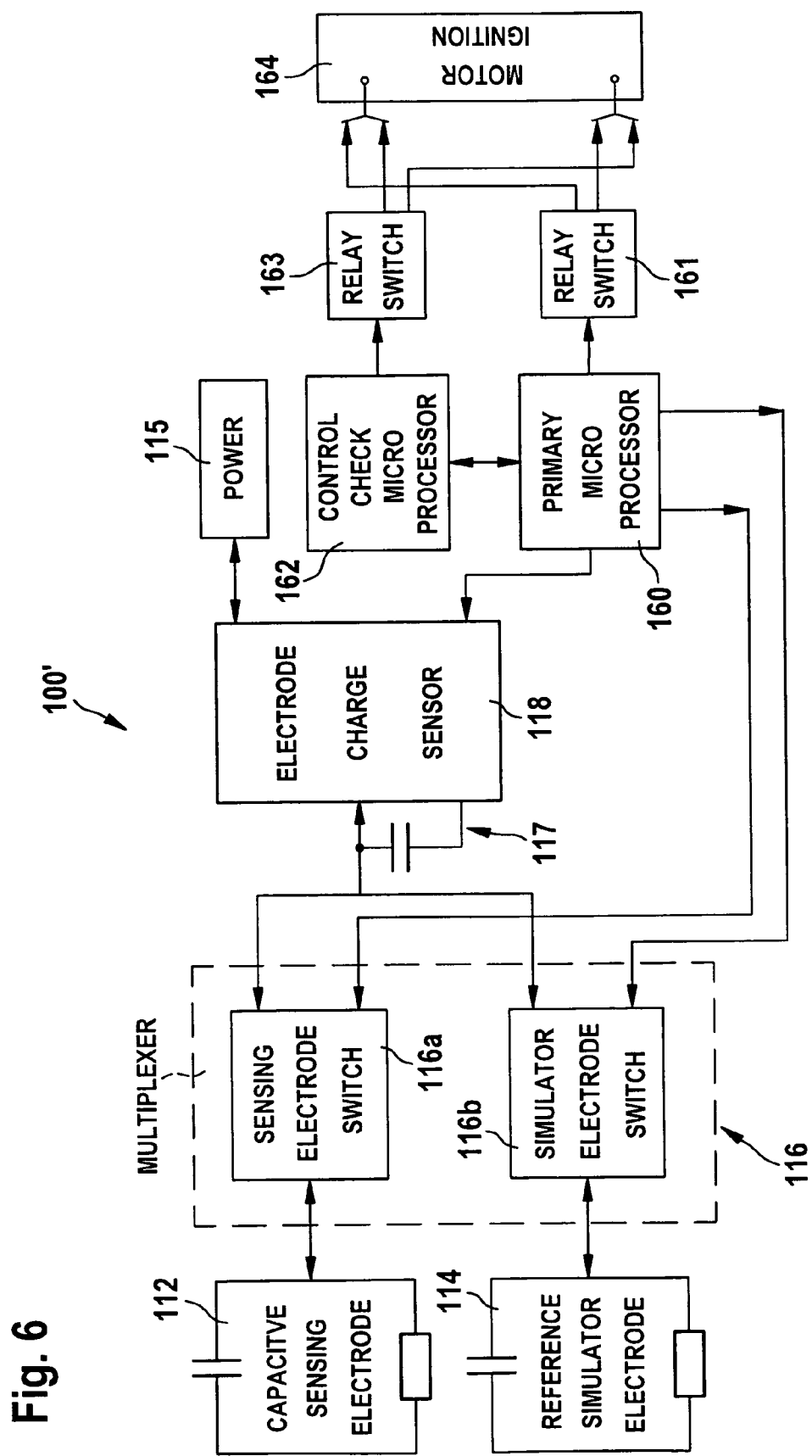
FIG. 6 is a schematic diagram of another embodiment of a microcontroller that may be used on the operator-sensing circuit of FIG. 5.

FIG. 6 shows a second embodiment of an operator sensing circuit 100' having a fail-safe microcontroller. Microprocessor 160 electrically coupled to charge sensor 118 and microprocessor 162 electrically coupled to microprocessor 160. Microprocessor 160 is electrically coupled to multiplexer 116 for sequentially turning sensing element switch 116a and reference simulator element switch 116b on and off to send charge signals through the respective sensing element 112 and reference element 114.

Assuming that the push-lawnmower 130 of FIG. 1 is started without an operator's hand on one of the hand-grips 42 and 44.

Microprocessor 160 does not start commanding sensor 118 to send charge signals to multiplexing switches 116a and 116b until a hand-grip 42 or 44 is grasped.

Vehicle 55 has a clutch and can be started with or without hands-on either hand-grip 52 or 53 in the pre-calibrated system of the invention. In this instance, microcontroller 160 starts its commands to sensor 118 that sends a charge signal to sensing element 112 and reference element 114 upon releasing the clutch. In immediate response elements 112 and 114 send capacitive charge signals to charge sensor 118 which produces respective raw data output signals corresponding to the capacitive discharge signals received.

Microprocessor 160 outputs signals and sends them to microprocessor 162 to conduct a control check on microprocessor 160. Both microprocessors 160 and 162 outputs signals to produce an output microprocessor signal to its respective relay switch.

Both output microprocessor signals must be the same for relay switches 161 and 162 to respond in an identical manner and maintain power to motor ignition 164. Otherwise relay switches shut the ignition down when either one of the microprocessor output signals is not the same as the other.

Figure 8:
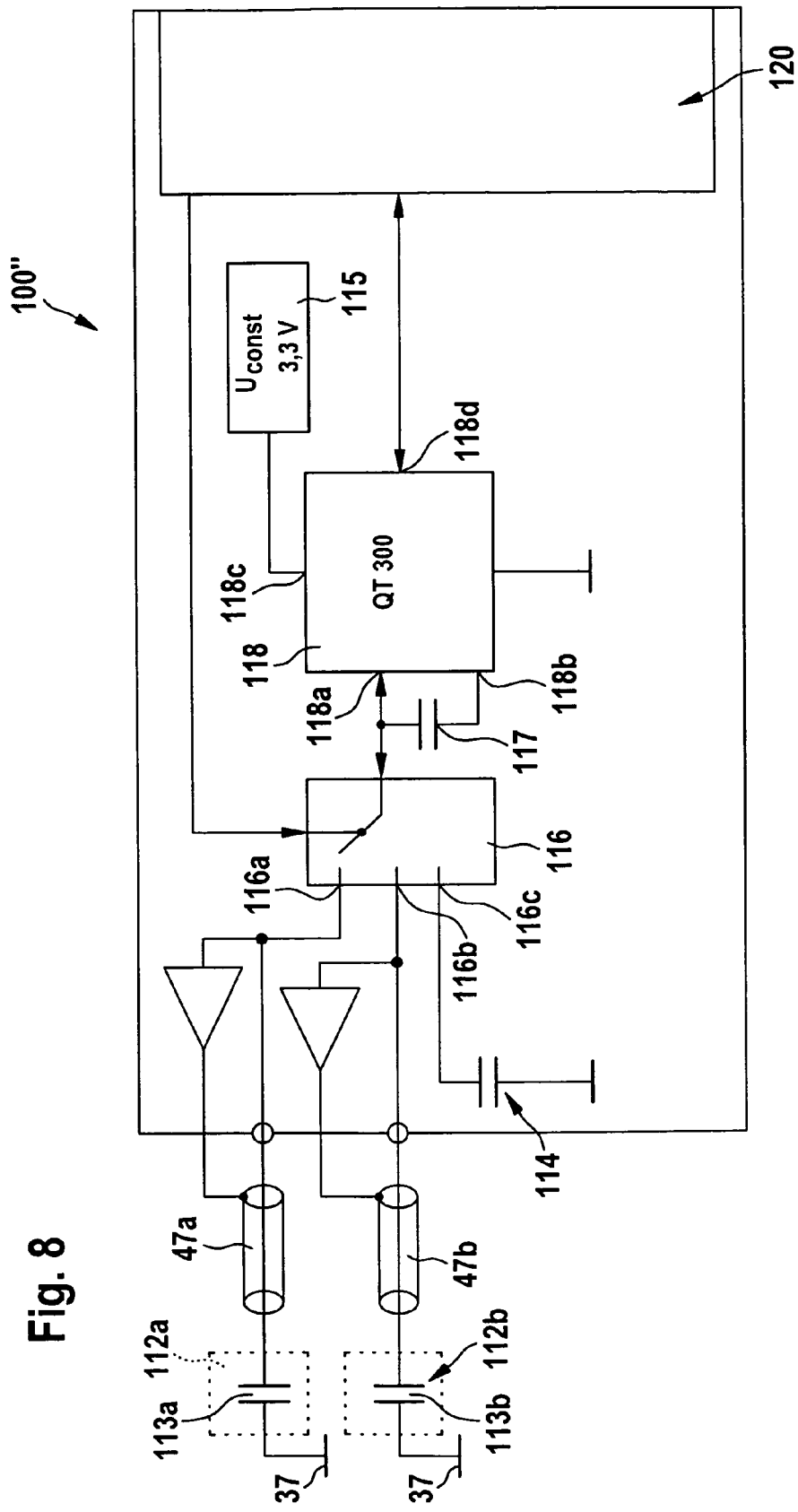
FIG. 8 is a schematic diagram of a third embodiment of the operator-sensing circuit.

In a third embodiment of an operator sensing circuit 100", shown in FIG. 8, charge sensor 118 is identical with charge sensor 118 described in the previous embodiments.

An advantageous embodiment of charge sensor 118 is a charge transfer sensor, for example QT300 of Quantum Research Group, 1 Mitchell Point, Ensign Way, Hamble SO31 4RF, Great Britain.

Further charge sensor 118 is provided with receiving capacitor 117, which is connected to terminals 118a and 118b of charge sensor 118.

In addition, charge sensor 118 is provided with a terminal 118c to which a constant voltage from battery 115 is supplied.

Further charge sensor 118 is provided with a output terminal 118d for outputting a charge signal value in the form of a burst of digits to microcontroller 120. Terminal 118a of charge sensor 118 is connected to multiplexer 116 which itself is controlled by microcontroller 120 in order to connect terminal 118a of charge sensor 118 to a first sensing element 112a, a second sensing element 112b and to reference simulator element 114 which in the third embodiment is an internal capacitor arranged within operator sensing circuit 100". Preferably first and second sensing elements 112a and 112b each comprise capacitors 113a, 113b respectively which on one hand are connected to output terminals 116a, 116b and 116c of multiplexer 116 and on the other hand connected to metal handle portion 37 which is connected to ground of operator sensing circuit 100.

The first sensing element 112a and second sensing element 112b are connected to terminals 116a and 116b of multiplexer 116 by shielded wires 47a and 47b.

For example first sensing element 112a and second sensing element 112b are the sensing elements associated with hand-grips 42 and 44. If only one hand-grip is provided one of sensing elements 112a, 112b can be omitted.

Figure 9:
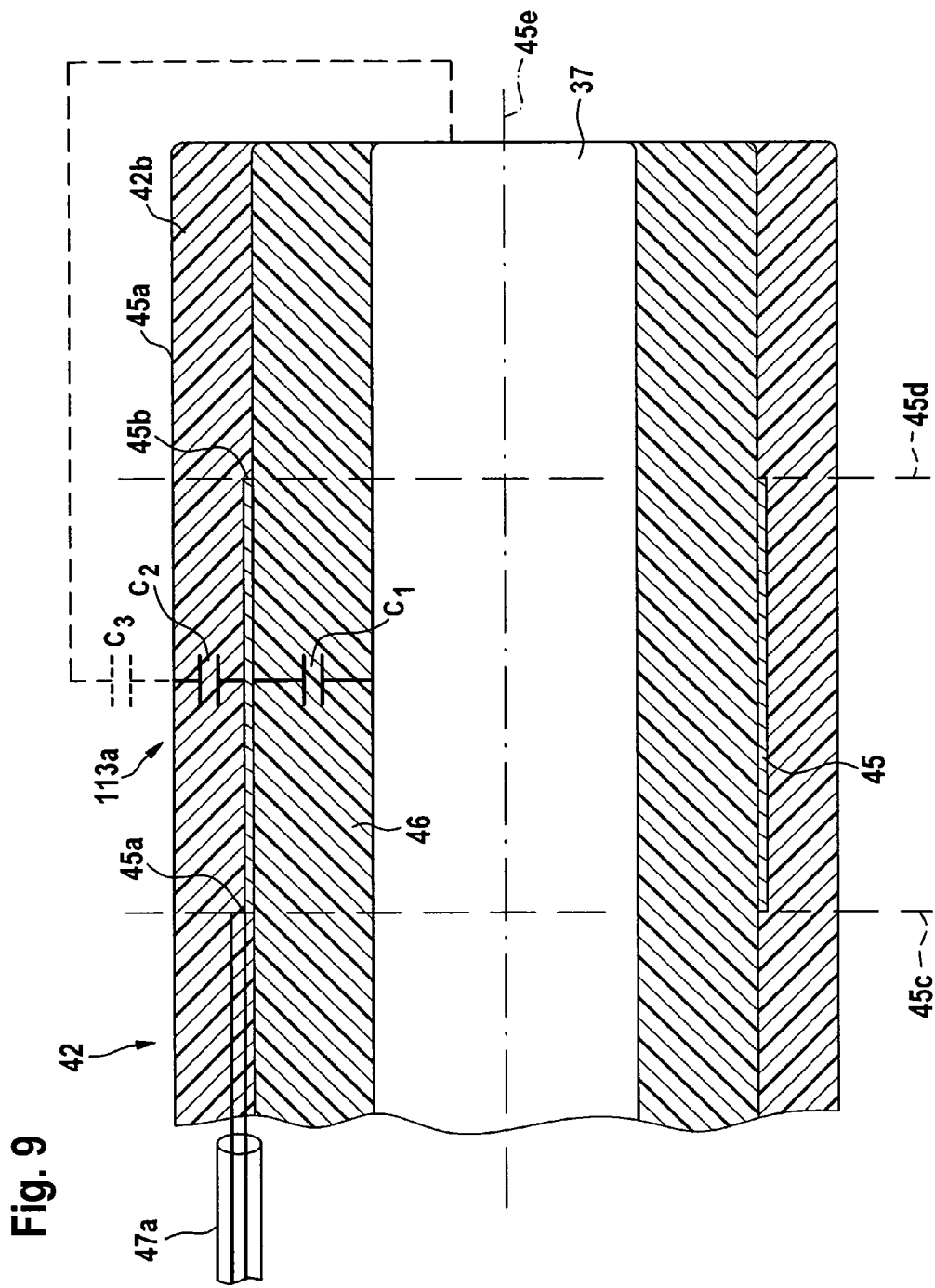
FIG. 9 is a fragmentary, elevational view, partially in section, of a further embodiment of a hand-grip.

As shown in FIG. 9 in a cross-section through hand-grip 42 handle portion 37 is provided with inner plastic tube 46 made of an isolating material.

A portion of inner plastic tube 46 is provided with metal foil tube 45 extending around inner plastic tube 46 between opposed end surface edges 45a and 45b which are arranged in respective planes 45c and 45d, said planes 45c and 45d extending transverse to the longitudinal axis 45e of metal foil tube 45. Preferably planes 45c and 45d extend perpendicular to longitudinal axis 45e.

Further inner plastic tube 46 with metal foil tube 45 arranged on it are covered by outer cover 42b extending from inner plastic tube 46 and from metal foil tube 45 to gripping surface 42a.

Due to the fact that inner plastic tube 46 is made of an isolating material a capacitor C1 is established between metal foil tube 45 being a first electrode thereof and handle portion 37 being a second electrode thereof.

Further if a human hand is gripping hand-grip 42 on gripping surface 42a gripping surface 42a can be considered to be a first virtual electrode of a capacitor C2 having metal foil tube 45 as its second electrode.

Further the hand-gripping surface 42a and the entire human body establish a capacitive coupling by capacitor C3 between the virtual electrode formed by gripping surface 42a and handle portion 37 and the entire frame of the device, metal handle portion 37 is connected to.

Consequently, capacitor 113a as shown in FIG. 8 in fact is formed by capacitors C1, C2 and C3 if a human hand is gripping gripping surface 42a wherein capacitors C2 and C3 are in serial arrangement and both are arranged parallel to capacitor C1, so that the total capacity of capacitor 113a in the so called hands-on state of capacitor 113a is formed by capacitor C1 and capacitors C2 and C3 in parallel to capacitor C1.

However, in the hands-off state in which the hand is not anymore gripping gripping surface 42a and entirely removed from hand-grip 42 capacitor C3 formed by the human hand and human body is not anymore existing.

Therefore, capacitor C2 lacks any connection to handlebar 36 and the frame of the device 30 so that the only relevant capacity is formed by capacitor C1 in the hands-off state.

FIG. 9 demonstrates that in the hands-off state capacitor 113a is only formed by capacitor C1 and therefore has a lower capacity than in the hands-on state, in which serial capacitors C2 and C3 are connected in parallel to capacitor C1, so that in the hands-on state the capacity of capacitor 113a is higher when compared to the hands-off state.

In order to increase the change in capacity of capacitor 113a when changing from the hands-off state to the hand-on state or vice versa it is important to keep capacitor C1 as small as possible and to increase capacitor C2.

Decreasing the capacity of capacitor C1 is achieved be choosing a material for inner plastic tube 46 with a low dielectric constant $\in_r$ and by making inner plastic tube 46 as thick as possible.

On the other hand increase of the capacity of capacitor C2 is achieved by choosing a material for outer cover 42b having a dielectric constant $\in_r$ which is as high as possible and by reducing the thickness of outer cover 42b to the lowest possible value. However the reduction of thickness of outer cover 42b is limited by the requirements for mechanical stability of the entire hand-grip 42 and the force to be applied to hand-grip 42 when operating lawnmower 30.

The increase of the dielectric constant of outer cover 42b is obtained by embedding particles with a high dielectric constant into the plastic material forming outer cover 42b.

It is advantageous to incorporate particles comprising carbon into the plastic material of outer cover 42b in order to increase the capacity of C2.

Charge sensor 118 according to the third embodiment of operating sensing circuit 100" when detecting the capacity of a capacitor connected thereto, for example capacitor 113a, operates as follows.

Usually capacitor 113a has a capacity which is about 40 pF to 60 pF, whereas capacitor 117 has a capacity which is about 150 nF, e.g. capacitor 117 has about more than 1.000 times the capacity of capacitor 113a.

For example a detection cycle performed by charge sensor 118 operates as follows.

Figure 10:
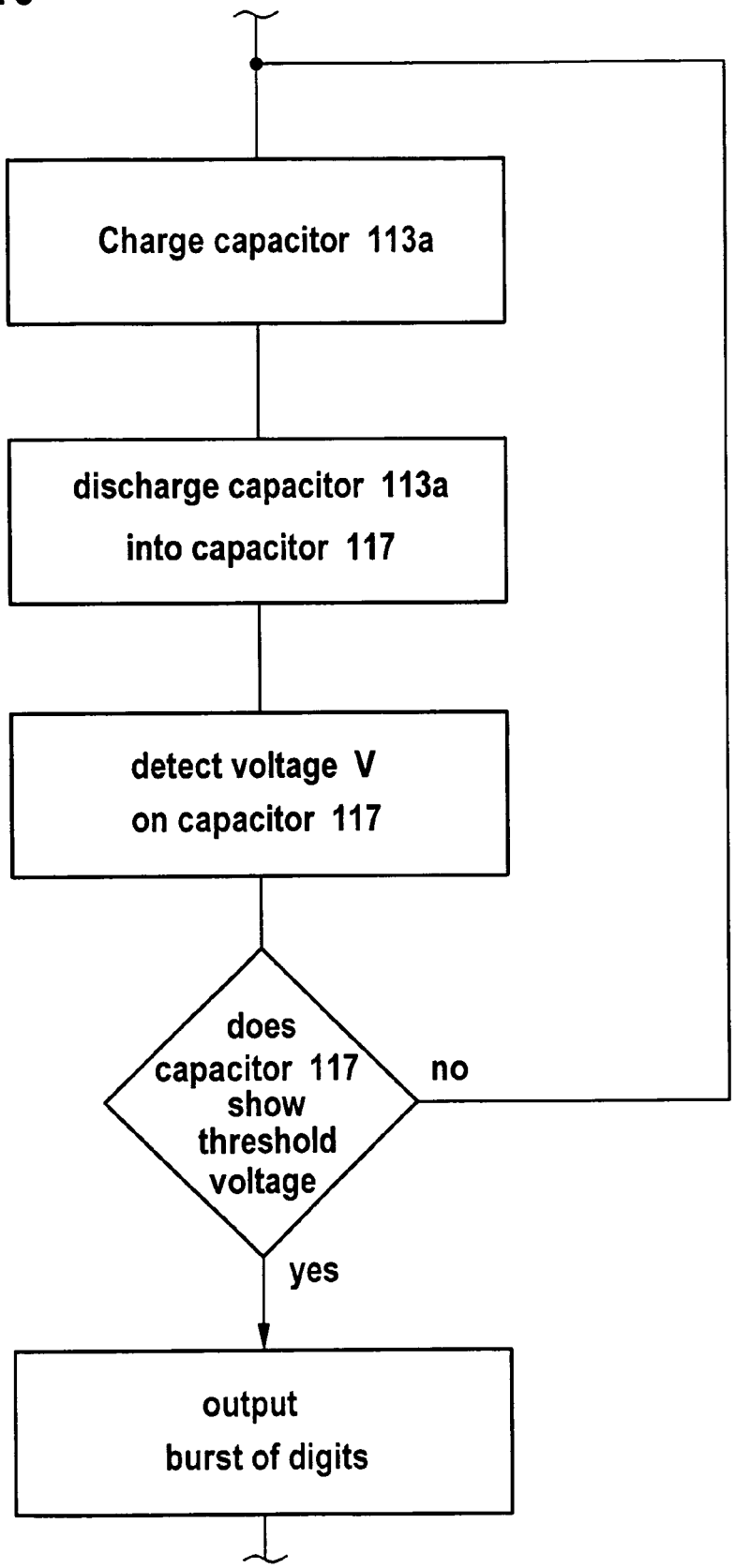
FIG. 10 is a schematic flow diagram of a charge/discharge cycle.

When starting the detection cycle charge sensor 118 starts a first charge/discharge cycle. In this first charge/discharge cycle capacitor 113a is charged by charge sensor 118 as shown in FIG. 10.

Thereafter the charge stored in capacitor 113a is transferred to receiving capacitor 117 by discharging capacitor 113a into capacitor 117. Since receiving capacitor 117 has a capacity which is about more than 1.000 times the capacity of capacitor 113a the first charge/discharge cycle results in a small increase of the charge capacitor 117, and the corresponding voltage is far below a threshold voltage as requested by charge sensor 130.

Consequently, charge sensor 118 will perform a next charge/discharge cycle of capacitor 113a if capacitor 117 does not show the threshold voltage at the end of the charge/discharge cycle.

In the course of a detection cycle charge sensor 118 will perform as many charge/discharge cycles of capacitor 113a as necessary in order to provide sufficient charge on capacitor 117 so that the voltage of capacitor 117 reaches the threshold voltage required by charge sensor 118.

If capacitor 117 reaches the threshold voltage, charge sensor 118 outputs a burst of digits via terminal 118d and transfers it to microcontroller 120, said burst of digits being representative of the capacity determined by the number of charge/discharge cycles.

For example a capacity of 40 pF to 60 pF of capacitor 113a corresponds to the hands-off state resulting in for example in a burst with about 900 digits.

If the capacity of capacitor 113a is increased the number of charge/discharge cycles necessary in order to reach the threshold voltage of capacitor 117 is reduced and consequently the number of digits in the burst corresponding to the number of charge/discharge cycles is also reduced so that in a hands-on state charge sensor 118 outputs a much lower number of digits to microcontroller 120. The number of digits in the burst is for example between about 700 digits and about 760 digits as shown in FIG. 7.

In order to obtain proper operation of operator sensing circuit 100" operator sensing circuit 100" has to be calibrated.

For calibration microcontroller 120 is operated in a calibration mode. The calibration mode can be called up by an external input to microcontroller 120 and the calibration mode is usually called up before the device provided with the operating sensor circuit 100" is delivered to a customer. However, it might also be possible to call up the calibration mode in the course of servicing the device.

In any case the calibration mode is not started by a user and in particular the calibration mode is not started by a user when starting operation of the device. Consequently, the calibration mode is disabled as long as the device can be operated by a user.

In the calibration mode the calibration of sensor elements 112a and 112b is performed in the hands-off state of both sensing elements 112 and 112b.

Figure 11:
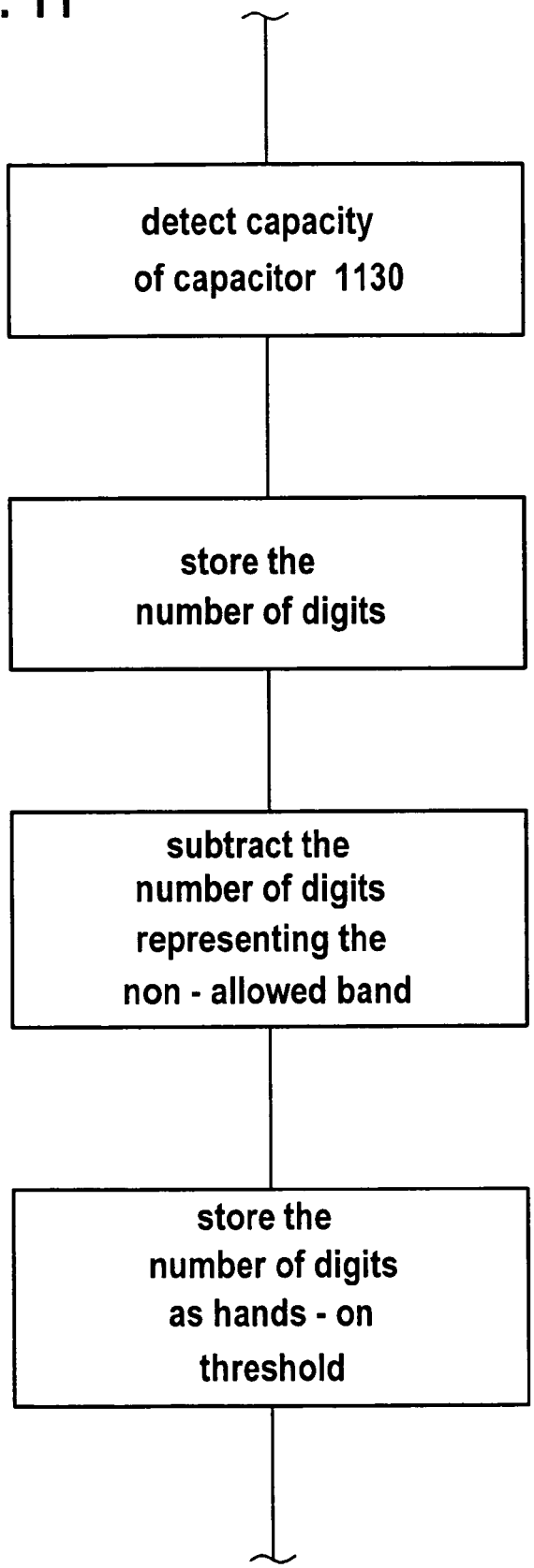
FIG. 11 is a schematic flow diagram of a calibration cycle.

As shown for example in FIG. 11 in connection with sensing element 112a microcontroller 120 controls multiplexer 116 in order to enable detection of the capacity of capacitor 113a as described previously.

The number of digits obtained in the course of this detection cycle is then output and stored by microcontroller 120.

In the next step microcontroller 120 subtracts from the number of digits stored the number of digits which represent the non-allowed range of operation as shown for example in FIG. 7.

If for example the number of digits received when detecting the capacity of capacitor 113*a* is 900 digits, microcontroller 120 will subtract a value of for example 140 digits, which represent the non-allowed range of operation, from the number of digits corresponding to the hands-off state so that the result is a value 760 digits and this value will be stored by microcontroller 120 as hands-on threshold value.

In another embodiment it is provided that the representing the hands-off state of capacitor 113*a* is stored and when starting microcontroller 120 the hands-on threshold value is calculated.

In the same manner the hands-on threshold level of sensing element 112*b* will be determined and stored by microcontroller 120.

When calibrating reference simulator element 114 represented by capacitor 114 microcontroller 120 will store the number of digits output by charge sensor 118 as reference value for proper operation.

After the calibration mode has been terminated the device, for example lawnmower 30, can be safely used by any user.

Figure 12:
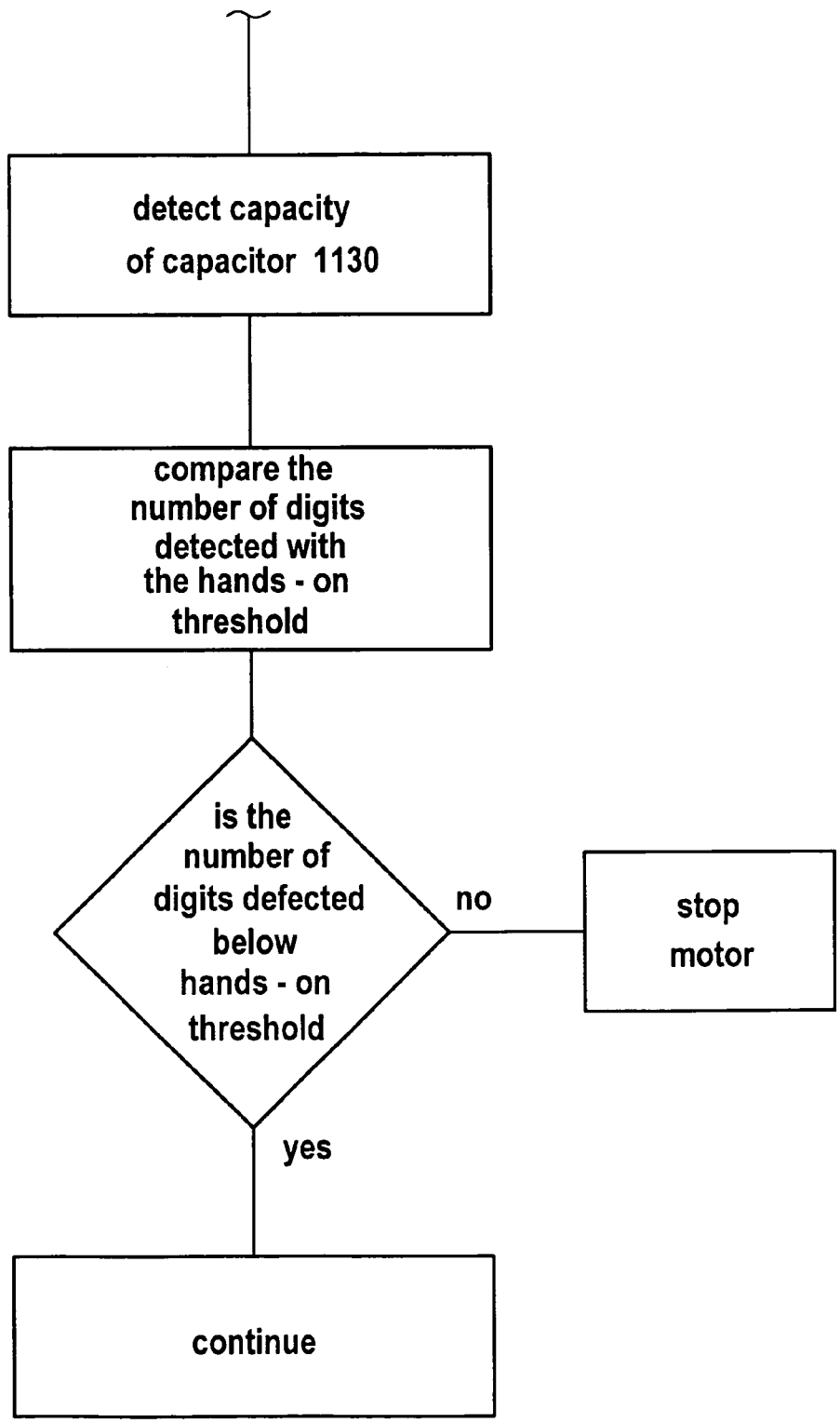
FIG. 12 is a schematic flow diagram of a detection cycle.

During use microcontroller 120 is operated in its sensing mode and in the sensing mode microcontroller 120 operates multiplexer 116 in continuously repeated sensing sequences in which the capacities of sensing element 112*a*, sensing element 112*b* and reference simulator element 114 are detected by charge sensor 118 and the corresponding bursts of digits are output to microcontroller 120 (FIG. 12).

When receiving the number of digits representing a capacity signal value and corresponding to the capacity of sensing electrode 112*a* or sensing element 112*b* microcontroller 120 compares said capacity signal value output by charge sensor 118 with the hands-on threshold value stored (FIG. 12).

If the number of digits is below the hands-on threshold value microcontroller 120 can assume that the hand is properly gripping hand-grip 42 and therefore in a proper hands-on state.

If however, the number of digits of the capacity signal value is above the hands-on threshold value then sensing element 112*a* does not assume a proper hands-on state and therefore, microcontroller 120 recognizes non proper hands-on state disables a drive by stopping the motor or by releasing a clutch or by other actions which bring the device in a safe state of operation (FIG. 12).

In addition, in its operation mode microcontroller 120 does not only detect the capacity of sensing elements 112*a* and 112*b* but also the capacity of reference simulator element 114 in order to ensure proper operation of the entire operating sensing circuit 100".

Therefore, microcontroller 120 controls multiplexer 116 in order to detect the capacity of reference simulator element 14.

The number of digits received representing a reference signal value is then compared with a number of digits stored in the course of the calibration mode and if the two numbers correspond to each other microcontroller 120 can assume that operator sensing circuit 100" is operating properly.

If however, the number of digits received significantly deviates from the number of digits stored in the calibration mode microcontroller 120 will initiate disabling of the drive of the device in the same manner as if the number of digits received when detecting sensing elements 112*a* and 112*b* is below the hands-on threshold value.

In an improved version the operational mode of microcontroller 120 when detecting the capacity of sensing elements 112*a* and 112*b* does not only detect whether or not the number of digits of the capacity signal value is below the hands-on threshold value but also detects whether the number of digits is within a range of reasonable values of digits for a hands-on state. Such range is defined by a range of predefined operational values. If the capacity signal value is out of said range microcontroller disables the drive of the device.

For example microcontroller 120 will verify whether or not the number of digits received is within a predefined range of operational values. This range of predefined operational values can be for example defined by being between 1350 digits and 180 digits.

If for example the number of digits is received above 1350 digits microcontroller recognizes an unrealistic small value of the capacitor 113*a* and assumes electrical problems, such as for example a broken cable.

If for example the number of digits received is below 180 digits microcontroller 120 has to assume that the respective sensing element 112 might be damaged or any other component of the operating sensing circuit 100" might not properly operate any more and consequently, also disable the drive of the device.

Further when detecting the capacity of reference simulator element 114 microcontroller 120 can evaluate whether the number of digits detected is within a reasonable range for proper operation. This range is defined by a preselected stored reference range.

If for example, the number of digits stored in the calibration mode is 1300 the number of digits received in the operation mode can be allowed to be within a range of 1250 to 1350 digits so that minor deviations from the number of digits received in the calibration mode can be admitted when microcontroller 120 decides whether or not operator sensing circuit 100" is operating properly.

While the operator sensing circuit 100" for disabling a motor of power equipment has been shown and described in detail, it is obvious that this invention is not to be considered as limited to the exact form disclosed, and that changes in detail and construction may be made therein within the scope of the invention without departing from the spirit thereof.

The invention claimed is:

1. Operator sensing circuit for a hand-grip of a device, comprising:
   at least one capacitive sensing element incorporated in said hand-grip, said sensing element having a capacity which is changed in a hands-on state of an operator's hand on said hand-grip when compared with a hands-off state of said hand-grip,
   a charge sensor detecting at least a capacity of said sensing element and generating a capacity signal value representing said detected capacity,
   said charge sensor further detecting a capacity of a capacitive reference simulator element and generating a reference signal value indicative of said capacity,
   a controller connected to said charge sensor,
   said controller receiving said reference signal value and comparing said reference signal value with a preselected stored reference range in order to determine proper operative conditions of said sensing circuit if said reference signal value is within said reference range,
   said controller receiving said capacity signal value and comparing said capacity signal value with a preselected hands-on capacity signal value in order to distinguish between a proper hands-on state which is present if the capacity signal value is on a first side of said hands-on capacity signal value or a non-proper hands-on state, which is present if the capacity signal value is on a second side of said hands-on capacity signal value;

said hands-on capacity signal value being chosen to differentiate between (i) at least one of dirt and water on the hand-grip, and (ii) one of the operator's hand and the operator's hand in a glove on the hand-grip.

2. Operator sensing circuit as defined in claim 1, wherein said controller enables full operation of said device when the proper hands-on state is detected.

3. Operator sensing circuit as defined in claim 1, wherein said controller disables full operation of said device when the proper hands-on state is not detected.

4. Operator sensing circuit as defined in claim 1, wherein said controller reduces operation of said device to a safe operational state when the proper hands-on state is not detected.

5. Operator sensing circuit as defined in claim 4, wherein said controller stops driving of a dangerous component of said device.

6. Operator sensing circuit as defined in claim 5, wherein said controller interrupts a drive train for said dangerous component of said device.

7. Operator sensing circuit as defined in claim 1, wherein:
said capacitive sensing element comprises a first electrode arranged on an inner dielectric member,
said inner dielectric member is disposed on a second electrode, and
said first electrode is covered by an outer dielectric member.

8. Operator sensing circuit as defined in claim 7, wherein said first electrode has a tube-like structural configuration.

9. Operator sensing circuit as defined in claim 7, wherein said first electrode comprises a conductive foil.

10. Operator sensing circuit as defined in claim 9, wherein said conduction foil is essentially free of perforations.

11. Operator sensing circuit as defined in claim 9, wherein said conductive foil is formed to a tube.

12. Operator sensing circuit as defined in claim 11, wherein said conductive foil has a form of a strip with opposed lateral edges forming said opposed edges of said first electrode when formed to a tube.

13. Operator sensing circuit as defined in claim 7, wherein said second electrode is formed by a handle gripping portion.

14. Operator sensing circuit as defined in claim 7, wherein:
said first and second electrodes together with said inner dielectric member therebetween establish a first capacity,
said first electrode with said gripping surface and said outer dielectric member therebetween establish a second capacity which in a hands-on state is in series with a third capacity formed by a human body, and
said second capacity and said third capacity are arranged in parallel to said first capacity.

15. Operator sensing circuit as defined in claim 1, wherein:
said charge sensor is provided with a receiving capacitor, and
in a charge detection cycle said charge sensor performs a plurality of charge/discharge cycles within each of which the capacity in the element to be detected is charged and thereafter discharged into a receiving capacitor until said receiving capacitor is charged to a predefined level.

16. Operator sensing circuit for a hand-grip of a device, comprising:
at least one capacitive sensing element incorporated in said hand-grip, said sensing element having a capacity which is changed in a hands-on state of an operator's hand on said hand-grip when compared with a hands-off state of said hand-grip,
a charge sensor detecting at least a capacity of said sensing element and generating a capacity signal value representing said detected capacity,
a controller connected to said charge sensor and receiving said capacity signal value,
a range of predefined operational capacity signal values indicating proper operative conditions of said sensing element and being stored in said controller,
said controller comparing said capacity signal value with said range of predefined operational capacity signal values in order to determine a presence of the proper operative conditions of said sensing element if said capacity signal value is within said range in order to distinguish between a proper functional state which is present if the capacity signal value is within said range, or a nonproper functional state, which is present if the capacity signal value is outside of said range; and
a hands-on range of predefined capacity signal values;
said hands-on range being chosen to differentiate between (i) at least one of dirt and water on the hand-grip, and (ii) one of the operator's hand and the operator's hand in a glove on the hand-grip;
said controller further comparing said capacity signal value with said hands-on range in order to determine a proper hands-on state which is present if the capacity signal value is within said hands-on range.

17. Operator sensing circuit as defined in claim 16, wherein said range of predefined operational capacity signal values extends from a preselected stored uppermost limit value above said preselected hands-on threshold value range and to a preselected stored lowermost limit value below said preselected hands-on range.

18. Operator sensing circuit as defined in claim 16, wherein said controller enables full operation of said device when the presence of proper operative conditions and a proper hands-on state is determined.

19. Operator sensing circuit as defined in claim 16, wherein said controller disables full operation of said device when the presence of proper operative conditions or a proper hands-on state is not determined.

20. Operator sensing circuit as defined in claim 16, wherein said controller reduces operation of said device to a safe operational state when the presence of proper operative conditions or a proper hands-on state is not determined.

21. Operator sensing circuit as defined in claim 1, wherein said controller enables full operation of said device when the presence of proper operative conditions and the proper hands-on state is determined.

22. Operator sensing circuit as defined in claim 1, wherein said controller disables full operation of said device when the presence of proper operative conditions is not determined.

23. Operator sensing circuit as defined in claim 1, wherein said controller reduces operation of said device to a safe operational state when the presence of proper operative conditions is not determined.

24. Operator sensing circuit as defined in claim 1, wherein said charge sensor sequentially detects said capacity of said at least one sensing element and said reference simulator element.

25. Operator sensing circuit as defined in claim 24, wherein a first sensing element and a second sensing element are provided and wherein said charge sensor sequentially detects said capacity of said first sensing element and said second sensing element.

26. Operator sensing circuit as defined in claim 24, wherein said charge sensor is sequentially connected to said at least one sensing element and said reference simulator element by a multiplexer.

27. Operator sensing circuit as defined in claim 26, wherein said multiplexer is controlled by said controller.

28. Operator sensing circuit for a hand-grip of a device, comprising:
at least one capacitive sensing element incorporated in said hand-grip, said sensing element having a capacity which is changed in a hands-on state of an operator's hand on said hand-grip when compared with a hands-off state of said hand-grip,
said capacitive sensing element comprises a first electrode arranged on an inner dielectric member,
said inner dielectric member being disposed on a second electrode,
said first electrode being covered by an outer dielectric member and having a tube-like structural configuration which extends between opposed edges in a direction of its axis with an extension which is smaller than an extension of an operator's hand in said direction when gripping said hand-grip,
a charge sensor detecting at least a capacity of said sensing element and generating a capacity signal value representing said detected capacity,
a controller connected to said charge sensor and receiving said capacity signal value,
said controller comparing said capacity signal value with a predetermined hands-on range of capacity signal values extending between an upper capacity signal value and a lower non-zero capacity signal value in order to distinguish between a proper hands-on state which is present if the capacity signal value is within said hands-on threshold range of capacity signal values or a non-proper hands-on state, which is present if the capacity signal value is outside of said hands-on range of capacity signal values;
said hands-on range of capacity signal values being chosen to differentiate between (i) at least one of dirt and water on the hand-grip, and (ii) one of the operator's hand and the operator's hand in a glove on the hand-grip.

29. Operator sensing circuit for a hand-grip of a device, comprising:
at least one capacitive sensing element incorporated in said hand-grip, said sensing element having a capacity which is changed in a hands-on state of an operator's hand on said hand-grip when compared with a hands-off state of said hand-grip,
said capacitive sensing element comprises a first electrode arranged on an inner dielectric member,
said inner dielectric member being disposed on a second electrode formed by a handle portion,
said first electrode being covered by an outer dielectric member,
said first and second electrodes together with said inner dielectric member therebetween establishing a first capacity,
said first electrode with said gripping surface in said hands-on state and said outer dielectric member therebetween establishing a second capacity which is greater than said first capacity,
a human body establishing a third capacity in said hands-on state,
said third capacity and said second capacity being in serial arrangement and parallel to said first capacity and defining the capacity of said capacitive sensing element;
a charge sensor detecting the capacity of said capacitive sensing element and generating a capacity signal value representing said detected capacity,
a controller connected to said charge sensor and receiving said capacity signal value,
said controller comparing said capacity signal value with a predetermined hands-on capacity signal value in order to distinguish between a proper hands-on state which is present if the capacity signal value is on a first side of said hands-on capacity signal value or a non-proper hands-on state, which is present if the capacity signal value is on a second side of said hands-on capacity signal value;
said hands-on capacity signal value being chosen to differentiate between (i) at least one of dirt and water on the hand-grip, and (ii) one of the operator's hand and the operator's hand in a glove on the hand-grip.

30. An operator-sensing circuit for a hand-grip of a device, comprising:
a capacitive sensing element incorporated in said hand-grip, said sensing element having a capacity which is changed in a hands-on state of an operator's hand on said hand-grip when compared with a hands-off state of said hand-grip;
a charge-transfer sensor detecting at least a capacity of said sensing element and generating a capacity signal value representing said detected capacity,
a controller connected to said charge transfer sensor and receiving said capacity signal value,
said controller comparing said capacity signal value with a preselected hands-on capacity signal value in order to distinguish between a proper hands-on state which is present if the capacity signal value is on a first side of said hands-on capacity signal value or a non-proper hands-on state, which is present if the capacity signal value is on a second side of said hands-on capacity signal value,
said hands-on capacity value being chosen to differentiate between (i) at least one of dirt and water on the hand-grip, and (ii) one of the operator's hand and the operator's hand in a glove on the hand-grip, said controller detecting said capacity signal value to be within or not within a predefined range of operational values that designate an absence of functional problems of said operator sensing circuit;
said range of operational values being chosen to comprise said capacity signal values corresponding to proper hands-on states and non-proper hands-on states;
said predefined range of operational values being effective to detect functional problems of said operator sensing circuit if said capacity signal is not within said predefined range of operational values; and
said controller enables full operation of said device when the presence of a proper hands-on state and the absence of functional problems is determined.

31. An operator sensing circuit as defined in claim 30, wherein said capacitive means sensing element comprises:
operator-hand sensing electrode means having an inner dielectric material layer contiguously disposed on a metal handle portion of the power equipment,
a metal conductor material layer contiguously disposed on the dielectric material, and
an outer dielectric hand-grip material including a surface of said hand-gripping surface thereby producing a capacitance in a grasping operator's hand, the outer hand-grip material, and the metal conductor material layer, said metal conductor material layer including a metal foil wrapper around said inner dielectric material.

32. An operator sensing circuit as defined in claim 31, wherein:
said metal conductor material layer comprises copper, and the foil layer has a thickness of about 0.10 mm to about 0.15 mm.

33. An operator sensing circuit as defined in claim 32, wherein:
said inner dielectric material layer has a structural configuration of a tube that extends along a length of the metal handle portion;
said metal foil has a structural configuration of a tube having a longitudinal axis and that extends along a delimited length of the inner dielectric material tube, and has opposed end edges that are each disposed in respective planes that traverse a longitudinal axis of the metal foil tube; and
said outer hand-grip material has a length sufficient to overlap the opposed end edges of the metal foil tube.

34. An operator sensing circuit as defined in claim 33, wherein:
said metal foil tube has a length of from about 50 mm to about 60 mm,
the opposed end edges are disposed about 30 mm from ends of the hand-grip material, and
the opposed respective transverse planes are perpendicular to the longitudinal axis of the foil tube.

* * * * *

UNITED STATES PATENT AND TRADEMARK OFFICE
CERTIFICATE OF CORRECTION

| | | |
|---|---|---|
| PATENT NO. | : 7,795,882 B2 | Page 1 of 1 |
| APPLICATION NO. | : 11/504886 | |
| DATED | : September 14, 2010 | |
| INVENTOR(S) | : Kirchner et al. | |

It is certified that error appears in the above-identified patent and that said Letters Patent is hereby corrected as shown below:

Column 24, Line 33, claim 17 is corrected to read: --above said preselected hands-on range and to--

Column 25, Line 35, claim 28 is corrected to read: --range of capacity signal values or a non-proper--

Column 26, Line 57, claim 31 is corrected to read: --wherein said capacitive sensing element comprises:--

Column 26, Line 64, claim 31 is corrected to read: --of said hand-grip thereby producing a--

Signed and Sealed this

Seventh Day of December, 2010

David J. Kappos
*Director of the United States Patent and Trademark Office*